US012676597B2

(12) United States Patent
Huang et al.

(10) Patent No.: US 12,676,597 B2
(45) Date of Patent: Jul. 7, 2026

(54) SURFACE ACOUSTIC WAVE RESONATOR DEVICE AND MANUFACTURING METHOD THEREOF

(71) Applicant: Shenzhen Newsonic Technologies Co., Ltd., Shenzhen (CN)

(72) Inventors: Lei Huang, Shenzhen (CN); Jie Zou, Shenzhen (CN); Duan Feng, Shenzhen (CN)

(73) Assignee: Shenzhe Newsonic Technologies Co., Ltd., Shenzhen (CN)

( * ) Notice: Subject to any disclaimer, the term of this patent is extended or adjusted under 35 U.S.C. 154(b) by 0 days.

(21) Appl. No.: 19/027,371

(22) Filed: Jan. 17, 2025

(65) Prior Publication Data

US 2025/0167763 A1 May 22, 2025

(30) Foreign Application Priority Data

Jul. 29, 2024 (CN) ......................... 202411032003.3

(51) Int. Cl.
H03H 9/25 (2006.01)
H03H 3/08 (2006.01)
H03H 9/02 (2006.01)

(52) U.S. Cl.
CPC ................ H03H 9/25 (2013.01); H03H 3/08 (2013.01); H03H 9/02834 (2013.01)

(58) Field of Classification Search
CPC ........ H03H 9/25; H03H 9/64; H03H 9/02535; H03H 9/02834; H03H 9/145
See application file for complete search history.

(56) References Cited

U.S. PATENT DOCUMENTS

| | | | | |
|---|---|---|---|---|
| 9,640,750 B2 * | 5/2017 | Nakanishi | .......... | H03H 9/02834 |
| 11,444,599 B2 * | 9/2022 | Sasaki | ...................... | H03H 9/13 |
| 11,588,469 B2 * | 2/2023 | Daimon | ............. | H03H 9/02866 |
| 11,804,822 B2 * | 10/2023 | Fukuhara | .......... | H03H 9/14541 |
| 11,824,518 B2 * | 11/2023 | Takigawa | ............. | H03H 9/1457 |
| 12,166,466 B2 * | 12/2024 | Huebner | ................. | H03H 3/10 |

* cited by examiner

*Primary Examiner* — Andrea Lindgren Baltzell
*Assistant Examiner* — Alan Wong
(74) *Attorney, Agent, or Firm* — LEASON ELLIS LLP

(57) ABSTRACT

A surface acoustic wave resonator device and manufacturing method thereof, the surface acoustic wave resonator device has an interdigital electrode region including a first peripheral region, a first end region, a central region, a second end region and a second peripheral region, and includes: an interdigital transducer, disposed on a piezoelectric substrate and including interdigital electrodes located in the interdigital electrode region; an intermediate layer, disposed on the piezoelectric substrate and covering the interdigital transducer; an acoustic velocity adjusting layer, disposed on a side of at least a portion of the intermediate layer away from the piezoelectric substrate; and a passivation layer, disposed on a side of the intermediate layer away from the piezoelectric substrate, wherein the acoustic velocity adjusting layer is located in the central region, overlaps with portions of the interdigital electrodes located in the central region in a direction perpendicular to the piezoelectric substrate.

16 Claims, 20 Drawing Sheets

SURFACE ACOUSTIC WAVE RESONATOR DEVICE AND MANUFACTURING METHOD THEREOF

CROSS-REFERENCE TO RELATED APPLICATION(S)

This application claims priority to the Chinese patent application No. 202411032003.3, filed on Jul. 29, 2024, the entire disclosure of which is incorporated herein by reference as a part of the present application.

TECHNICAL FIELD

Embodiments of the present disclosure relate to a surface acoustic wave resonator device and a manufacturing method thereof.

BACKGROUND

With the rapid development of mobile communication technology, filters based on resonators are more and more widely used in communication devices such as smart phones. As a kind of acoustic wave filter, surface acoustic wave (SAW) filter has the advantages of small size and light weight, and is widely used in communication devices at present. There exist traverse waves in spurious mode in the traditional surface acoustic wave resonator, which will affect the performance of the resonator.

SUMMARY

At least one embodiment of the present disclosure provides a surface acoustic wave resonator device, having an interdigital electrode region including a first peripheral region, a first end region, a central region, a second end region and a second peripheral region sequentially arranged in a first direction, and the surface acoustic wave resonator device including: a piezoelectric substrate; an interdigital transducer, disposed on the piezoelectric substrate and including a plurality of interdigital electrodes which are located in the interdigital electrode region and include a first interdigital electrode and a second interdigital electrode; wherein the first interdigital electrode and the second interdigital electrode extend along the first direction and are alternately arranged along a second direction intersecting the first direction; the first interdigital electrode extends from the first peripheral region to the second end region, and the second interdigital electrode extends from the second peripheral region to the first end region; an intermediate layer, disposed on the piezoelectric substrate and covering the interdigital transducer; an acoustic velocity adjusting layer, disposed on a side of at least a portion of the intermediate layer which is away from the piezoelectric substrate; and a passivation layer, disposed on a side of the intermediate layer away from the piezoelectric substrate, wherein the acoustic velocity adjusting layer is located in the central region, overlaps with portions of the plurality of interdigital electrodes located in the central region in a direction perpendicular to a main surface of the piezoelectric substrate, and is configured to change an acoustic velocity in the central region.

In the surface acoustic wave resonator device provided by at least one embodiment of the present disclosure, the acoustic velocity adjusting layer is configured to accelerate the acoustic velocity in the central region, so that the acoustic velocity in the central region is different from an acoustic velocity in the first end region and an acoustic velocity in the second end region.

In the surface acoustic wave resonator device provided by at least one embodiment of the present disclosure, orthographic projections, on the piezoelectric substrate, of the portions of the plurality of interdigital electrodes located in the central region are located within an orthographic projection of the acoustic velocity adjusting layer on the piezoelectric substrate.

In the surface acoustic wave resonator device provided by at least one embodiment of the present disclosure, orthographic projections, on the piezoelectric substrate, of portions of the plurality of interdigital electrodes located in the first end region, the second end region, the first peripheral region and the second peripheral region are offset from an orthographic projection of the acoustic velocity adjusting layer on the piezoelectric substrate.

In the surface acoustic wave resonator device provided by at least one embodiment of the present disclosure, the intermediate layer has a recess, and at least a portion of the acoustic velocity adjusting layer is located in the recess of the intermediate layer.

In the surface acoustic wave resonator device provided by at least one embodiment of the present disclosure, an orthographic projection of the acoustic velocity adjusting layer on the piezoelectric substrate is offset from an orthographic projection of the passivation layer on the piezoelectric substrate.

In the surface acoustic wave resonator device provided by at least one embodiment of the present disclosure, the passivation layer further covers a surface of the acoustic velocity adjusting layer at a side away from the piezoelectric substrate.

In the surface acoustic wave resonator device provided by at least one embodiment of the present disclosure, a surface of the acoustic velocity adjusting layer at a side away from the piezoelectric substrate is level with a surface of the intermediate layer at a side away from the piezoelectric substrate in a direction parallel to the main surface of the piezoelectric substrate.

In the surface acoustic wave resonator device provided by at least one embodiment of the present disclosure, in the direction perpendicular to the main surface of the piezoelectric substrate, a distance between a surface of the acoustic velocity adjusting layer at a side away from the piezoelectric substrate and the main surface of the piezoelectric substrate is greater than or smaller than a distance between a surface of the intermediate layer at a side away from the piezoelectric substrate and the main surface of the piezoelectric substrate.

In the surface acoustic wave resonator device provided by at least one embodiment of the present disclosure, the acoustic velocity adjusting layer is located on a side of the passivation layer away from the piezoelectric substrate and covers a portion of a surface of the passivation layer.

In the surface acoustic wave resonator device provided by at least one embodiment of the present disclosure, the acoustic velocity adjusting layer is buried in the intermediate layer, and a surface of the acoustic velocity adjusting layer at a side away from the piezoelectric substrate is covered by the intermediate layer.

In the surface acoustic wave resonator device provided by at least one embodiment of the present disclosure, the intermediate layer includes a temperature compensation layer, and the acoustic velocity adjusting layer and the temperature compensation layer include different materials.

In the surface acoustic wave resonator device provided by at least one embodiment of the present disclosure, the acoustic velocity adjusting layer includes silicon nitride, aluminum nitride or a combination thereof.

The surface acoustic wave resonator device provided by at least one embodiment of the present disclosure, further includes: a first protruding structure, disposed in the first end region and the second end region, and configured to change an acoustic velocity in the first end region and an acoustic velocity in the second end region.

In the surface acoustic wave resonator device provided by at least one embodiment of the present disclosure, the first protruding structure is configured to reduce the acoustic velocity in the first end region and the acoustic velocity in the second end region.

In the surface acoustic wave resonator device provided by at least one embodiment of the present disclosure, the first protruding structure is disposed in a same layer as the interdigital transducer, and includes end parts of the plurality of interdigital electrodes located in the first end region and the second end region; the end parts of the plurality of interdigital electrodes each have a second width in the second direction, and the portions of the plurality of interdigital electrodes located in the central region each have a first width in the second direction, wherein the second width is greater than the first width.

In the surface acoustic wave resonator device provided by at least one embodiment of the present disclosure, the first protruding structure includes a plurality of first mass loading blocks, and the plurality of first mass loading blocks are respectively disposed on a side, away from the piezoelectric substrate, of end parts of the plurality of interdigital electrodes located in the first end region and the second end region.

In the surface acoustic wave resonator device provided by at least one embodiment of the present disclosure, each of the plurality of first mass loading blocks and an end part of a corresponding one interdigital electrode among the plurality of interdigital electrodes overlaps in the direction perpendicular to the main surface of the piezoelectric substrate, and has sidewalls aligned in the direction perpendicular to the main surface of the piezoelectric substrate.

In the surface acoustic wave resonator device provided by at least one embodiment of the present disclosure, an orthographic projection of the acoustic velocity adjusting layer on the piezoelectric substrate is offset from an orthographic projection of the first protruding structure on the piezoelectric substrate.

In the surface acoustic wave resonator device provided by at least one embodiment of the present disclosure, the acoustic velocity in the central region is greater than an acoustic velocity in the first end region and an acoustic velocity in the second end region.

In the surface acoustic wave resonator device provided by at least one embodiment of the present disclosure, the interdigital transducer further includes: a first bus bar and a second bus bar, located on two opposite sides of the interdigital electrode region in the first direction, and each extending along the second direction, wherein the first bus bar is located on a side of the first peripheral region and connected with the first interdigital electrode, and the second bus bar is located on a side of the second peripheral region and connected with the second interdigital electrode.

The surface acoustic wave resonator device provided by at least one embodiment of the present disclosure, further includes: a first additional bus bar, located in the first peripheral region, extending along the second direction, and connected with the first interdigital electrode; and a second additional bus bar, located in the second peripheral region, extending along the second direction, and connected with the second interdigital electrode.

The surface acoustic wave resonator device provided by at least one embodiment of the present disclosure, further includes: a first reflective grating and a second reflective grating, disposed on the piezoelectric substrate and arranged on two opposite sides of the interdigital transducer in the second direction, wherein an orthographic projection of the acoustic velocity adjusting layer on the piezoelectric substrate is offset from orthographic projections of the first reflective grating and the second reflective grating on the piezoelectric substrate; or, an orthographic projection of the acoustic velocity adjusting layer on the piezoelectric substrate overlaps with an orthographic projection of the first reflective grating and/or the second reflective grating on the piezoelectric substrate.

The surface acoustic wave resonator device provided by at least one embodiment of the present disclosure, further includes: a second protruding structure, disposed in extension regions of the first end region and the second end region in the second direction, wherein the second protruding structure includes a portion of the first reflective grating and/or the second reflective grating, or an orthographic projection of the second protruding structure on the piezoelectric substrate overlaps with the orthographic projection of the first reflective grating and/or the second reflective grating on the piezoelectric substrate.

In the surface acoustic wave resonator device provided by at least one embodiment of the present disclosure, the first reflective grating and the second reflective grating each include a plurality of reflective electrodes, which extend in the first direction and are arranged in the second direction, each of the plurality of reflective electrodes includes a first electrode portion, a second electrode portion and a third electrode portion, which are respectively located in extension regions of the central region, the first end region and the second end region in the second direction, widths of the second electrode portion and the third electrode portion in the second direction is greater than a width of the first electrode portion in the second direction, and the second protruding structure includes second electrode portions and third electrode portions of the plurality of reflective electrodes.

In the surface acoustic wave resonator device provided by at least one embodiment of the present disclosure, the second protruding structure includes a plurality of second mass loading blocks disposed on a side of the plurality of reflective electrodes of the first reflective grating and the second reflective grating away from the piezoelectric substrate, and are located in the extension regions of the first end region and the second end region in the second direction.

At least one embodiment of the present disclosure provides a manufacturing method of a surface acoustic wave resonator device, wherein the surface acoustic wave resonator device has an interdigital electrode region including a first peripheral region, a first end region, a central region, a second end region and a second peripheral region sequentially arranged in a first direction, and the manufacturing method includes: providing a piezoelectric substrate; forming an interdigital transducer on the piezoelectric substrate, wherein the interdigital transducer includes a plurality of interdigital electrodes which are located in the interdigital electrode region and include a first interdigital electrode and a second interdigital electrode; the first interdigital electrode and the second interdigital electrode extend along the first direction and are alternately arranged along a second direction intersecting the first direction; the first interdigital electrode extends from the first peripheral region to the second end region, and the second interdigital electrode extends from the second peripheral region to the first end region; forming an intermediate layer on the piezoelectric substrate to cover the interdigital transducer; forming an acoustic velocity adjusting layer on a side of at least a portion of the intermediate layer away from the piezoelectric substrate; and forming a passivation layer on a side of the intermediate layer away from the piezoelectric substrate, wherein the acoustic velocity adjusting layer is located in the central region, overlaps with portions of the plurality of interdigital electrodes located in the central region in a direction perpendicular to a main surface of the piezoelectric substrate, and is configured to change an acoustic velocity in the central region.

In the manufacturing method of the surface acoustic wave resonator device provided by at least one embodiment of the present disclosure, forming the acoustic velocity adjusting layer on the side of at least the portion of the intermediate layer away from the piezoelectric substrate includes: performing an etching process on the intermediate layer to remove a portion of the intermediate layer located in the central region, so as to form a recess in the intermediate layer; and forming the acoustic velocity adjusting layer in the recess of the intermediate layer.

In the manufacturing method of the surface acoustic wave resonator device provided by at least one embodiment of the present disclosure, forming the passivation layer includes: forming the passivation layer in a region other than the central region, so that the passivation layer exposes the acoustic velocity adjusting layer; or forming the passivation layer also in the central region to cover a surface of the acoustic velocity adjusting layer at a side away from the piezoelectric substrate.

In the manufacturing method of the surface acoustic wave resonator device provided by at least one embodiment of the present disclosure, after forming the passivation layer on the side of the intermediate layer away from the piezoelectric substrate, forming the acoustic velocity adjusting layer on a side of the passivation layer away from the piezoelectric substrate.

In the manufacturing method of the surface acoustic wave resonator device provided by at least one embodiment of the present disclosure, the intermediate layer includes a first intermediate sub-layer and a second intermediate sub-layer, and forming the intermediate layer and the acoustic velocity adjusting layer includes: after forming the first intermediate sub-layer, forming the acoustic velocity adjusting layer on a side of the first intermediate sub-layer away from the piezoelectric substrate; and after forming the acoustic velocity adjusting layer, forming the second intermediate sub-layer on the side of the first intermediate sub-layer away from the piezoelectric substrate to cover the first intermediate sub-layer and the acoustic velocity adjusting layer.

BRIEF DESCRIPTION OF DRAWINGS

In order to more clearly explain the technical solution of the embodiments of the present disclosure, the drawings of the embodiments will be briefly introduced below. It is obvious that the drawings in the following description only refer to some embodiments of the present disclosure, not the limitations of the present disclosure.

7

8

Figure 12A:
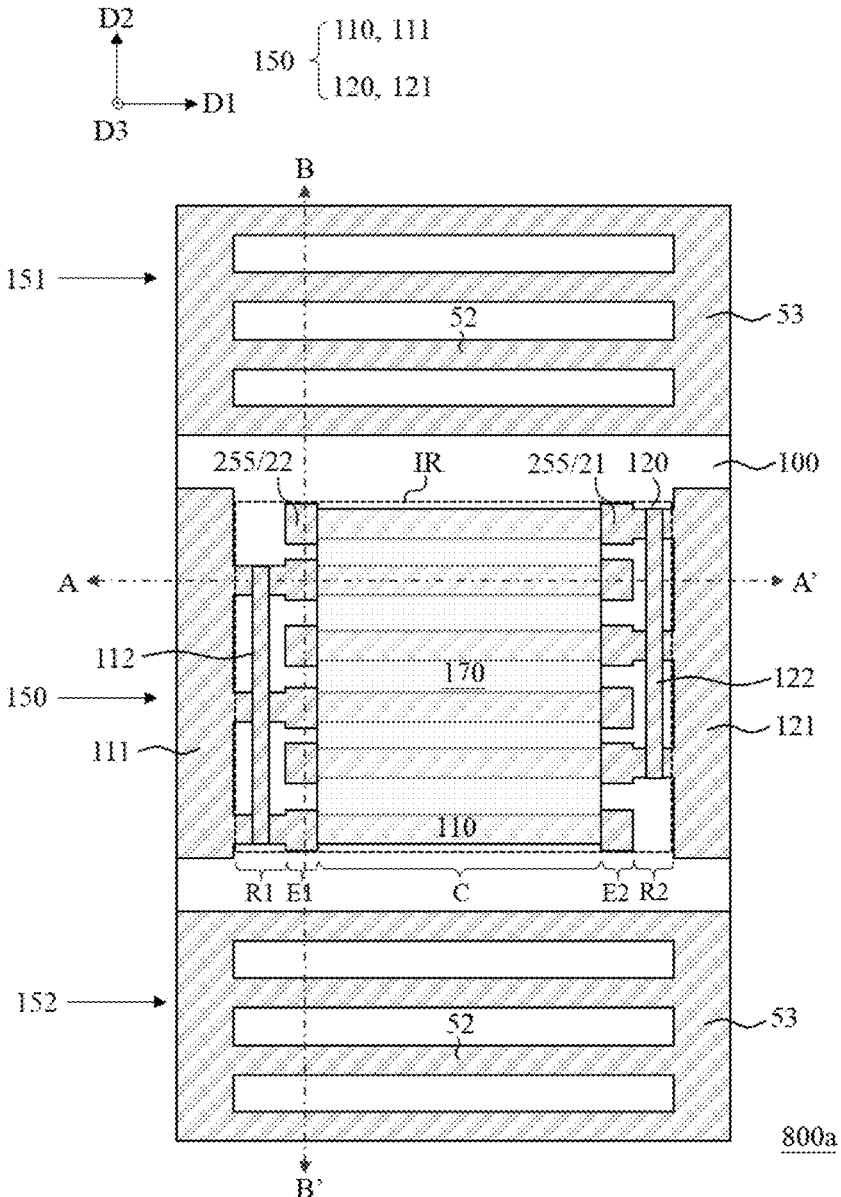
FIG. 12A illustrates a schematic plan view of a surface acoustic wave resonator device according to some further embodiments of the present disclosure.
Figure 13A:
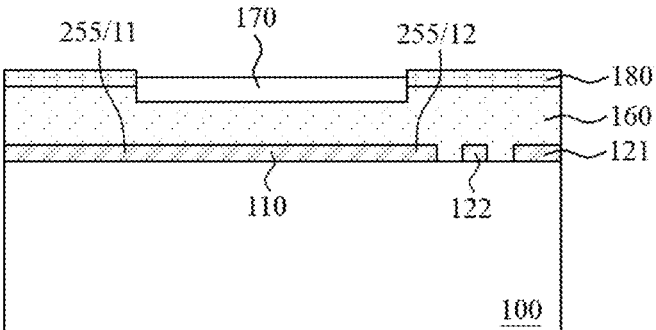
Figure 13B:
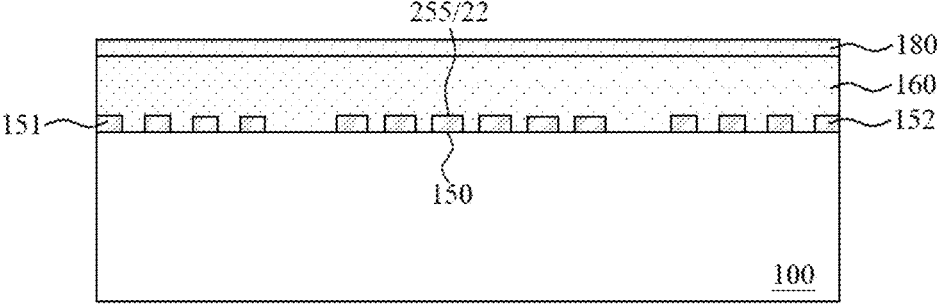
Figure 14A:
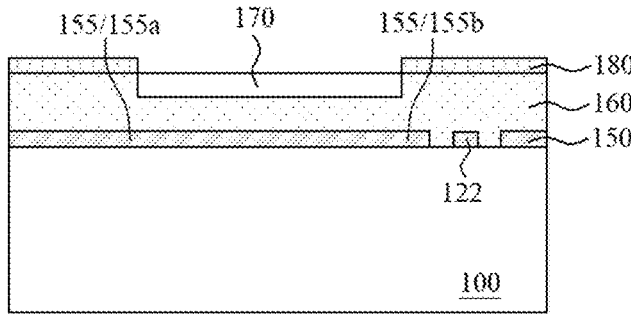
Figure 14B:
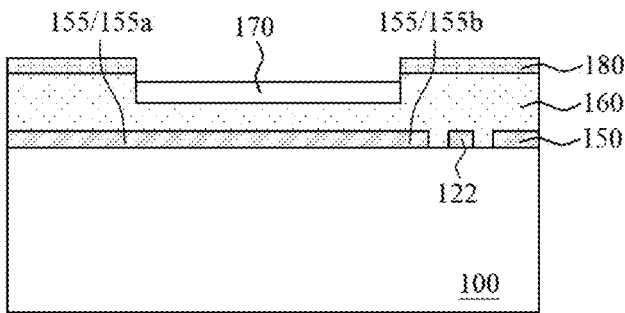
Figure 14C:
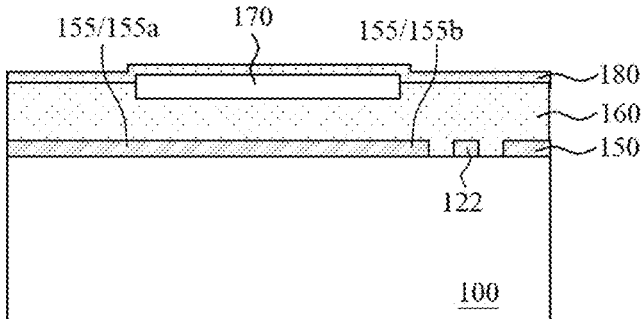
Figure 14D:
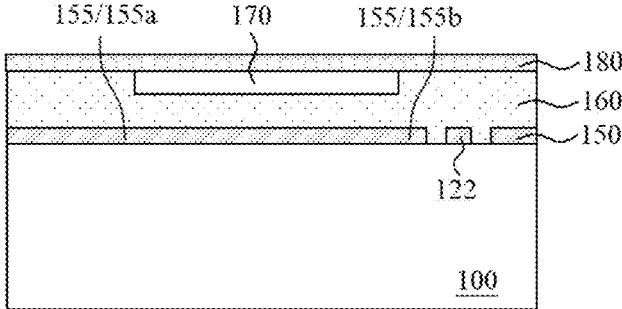
Figure 14E:
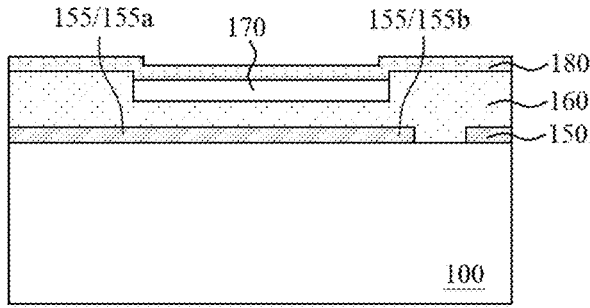
Figure 14F:
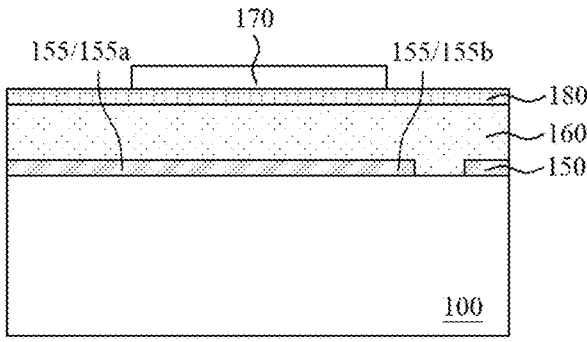
Figure 14G:
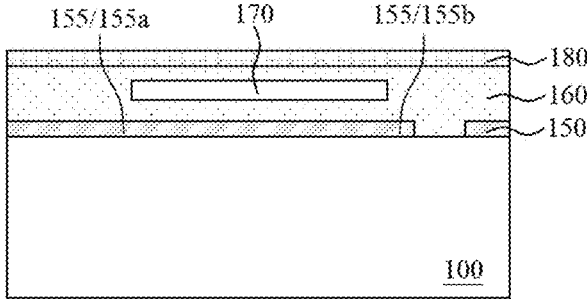
Figure 14H:
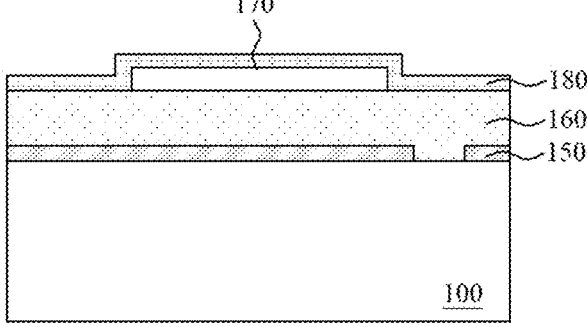

FIG. 13A and FIG. 13B illustrate schematic cross-sectional views of a surface acoustic wave resonator device according to some further embodiments of the present disclosure, and are cross-sectional views taken along line A-A' and line B-B' of FIG. 12A, respectively.

FIG. 14A to FIG. 14H illustrate schematic cross-sectional views of a surface acoustic wave resonator device taken along line A-A' of FIG. 12A according to still some other alternative embodiments of the present disclosure.

Figure 15A:
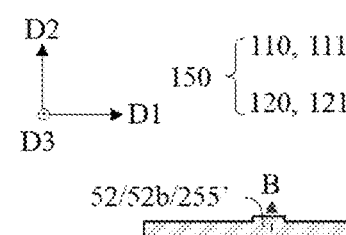
Figure 15A:
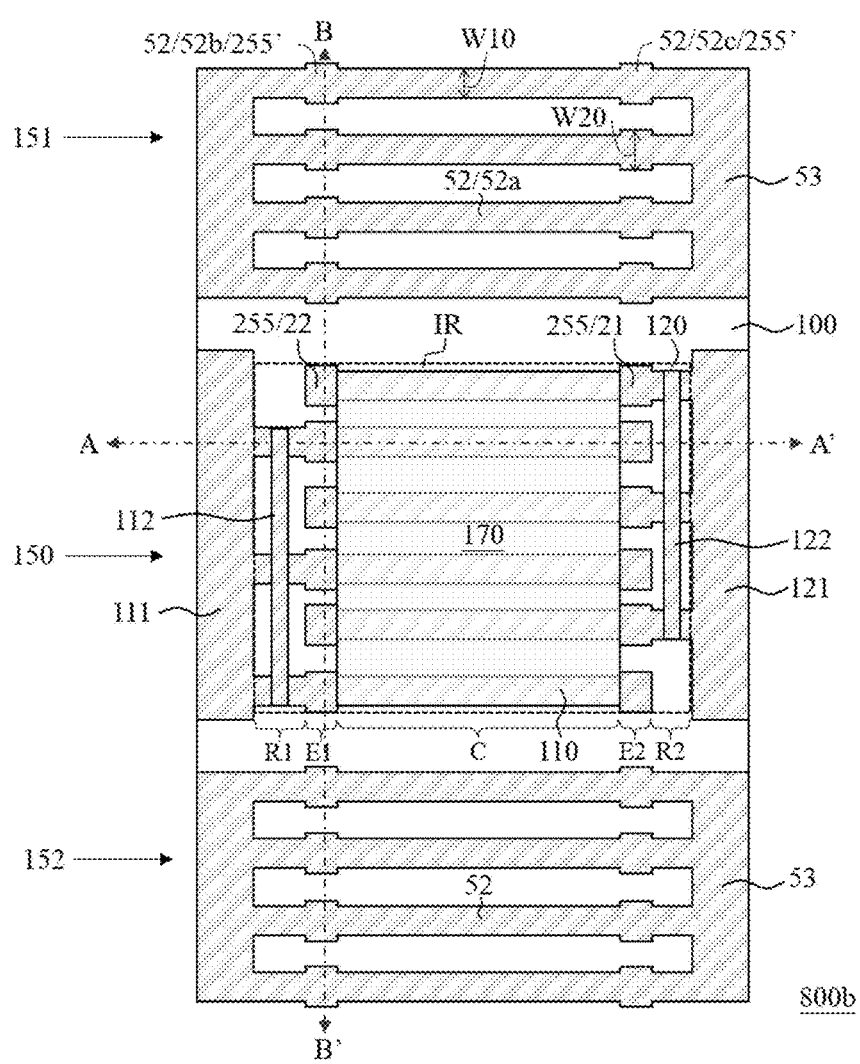
Figure 15B:
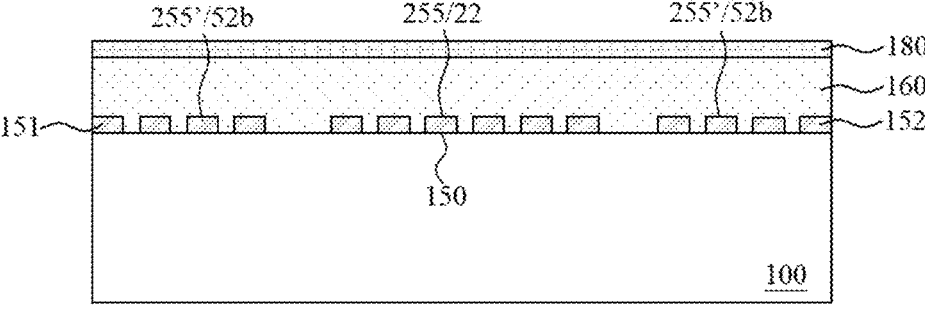

FIG. 15A illustrates a schematic plan view of a surface acoustic wave resonator device according to still some other alternative embodiments of the present disclosure; FIG. 15B illustrates a schematic cross-sectional view of a surface acoustic wave resonator device according to still some other alternative embodiments of the present disclosure, taken along line B-B' of FIG. 15A.

Figure 16:
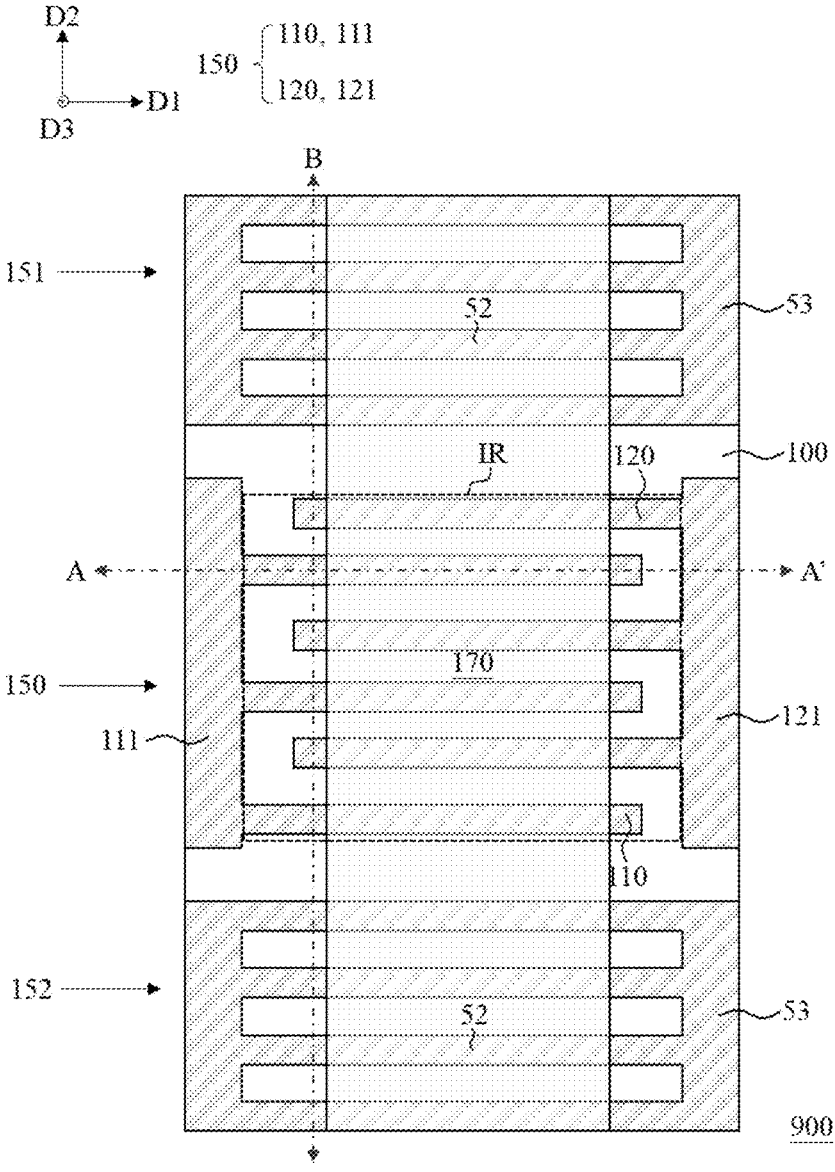

FIG. 16 illustrates a schematic plan view of a surface acoustic wave resonator device according to some further embodiments of the present disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise specified, the technical terms or scientific terms used in the disclosure shall have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly.

Embodiments of the present disclosure provide a surface acoustic wave resonator device, a manufacturing method thereof, and a filter including the same, which can effectively suppress clutter in the resonator, avoid or reduce energy loss, and further improve device performance.

For example, the surface acoustic wave resonator device according to the embodiments of the present disclosure has an interdigital electrode region including a first peripheral region, a first end region, a central region, a second end region and a second peripheral region sequentially arranged in a first direction, and the surface acoustic wave resonator device includes: a piezoelectric substrate; an interdigital transducer, disposed on the piezoelectric substrate and including a plurality of interdigital electrodes which are located in the interdigital electrode region and include a first interdigital electrode and a second interdigital electrode, wherein the first interdigital electrode and the second interdigital electrode extend along the first direction and are alternately arranged along a second direction intersecting the first direction, the first interdigital electrode extends from the first peripheral region to the second end region, and the second interdigital electrode extends from the second peripheral region to the first end region; an intermediate layer, disposed on the piezoelectric substrate and covering the interdigital transducer; an acoustic velocity adjusting layer, disposed on a side of at least a portion of the intermediate layer away from the piezoelectric substrate; and a passivation layer, disposed on a side of the intermediate layer away from the piezoelectric substrate; wherein the acoustic velocity adjusting layer is located in the central region, overlapped with portions of the plurality of interdigital electrodes located in the central region in a direction perpendicular to a main surface of the piezoelectric substrate, and is configured to change an acoustic velocity in the central region.

In the embodiments of the present disclosure, the acoustic velocity adjusting layer is disposed in the central region of the interdigital electrode region to change the acoustic velocity in the central region, so that there is an acoustic velocity difference between the central region and other regions such as the end regions, thereby achieving the effect of suppressing clutter.

Figure 1A:
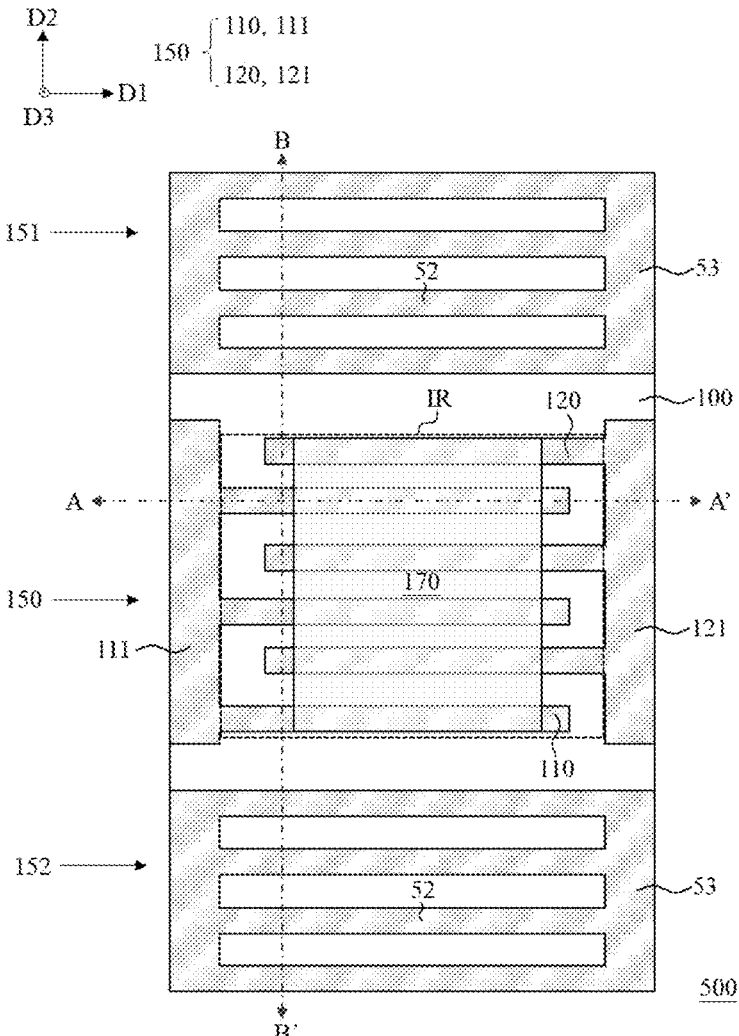
FIG. 1A illustrates a schematic plan view of a surface acoustic wave resonator device according to some embodiments of the present disclosure.
Figure 1B:
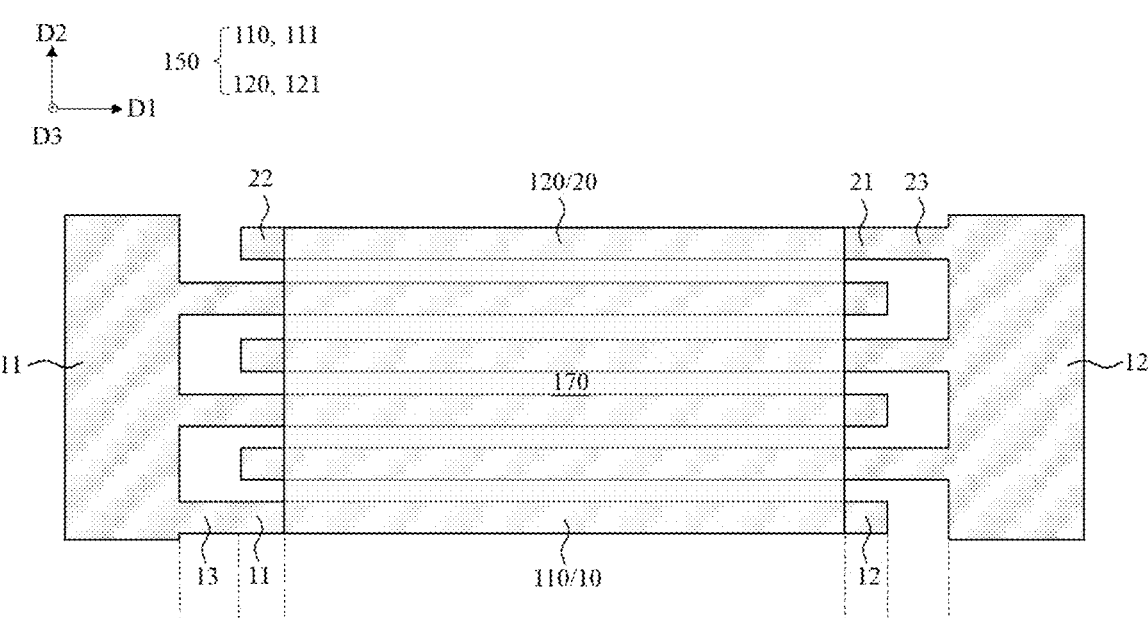
FIG. 1B illustrates a schematic enlarged plan view of an interdigital transducer in the surface acoustic wave resonator device illustrated in FIG. 1A according to some embodiments of the present disclosure.
Figure 2A:
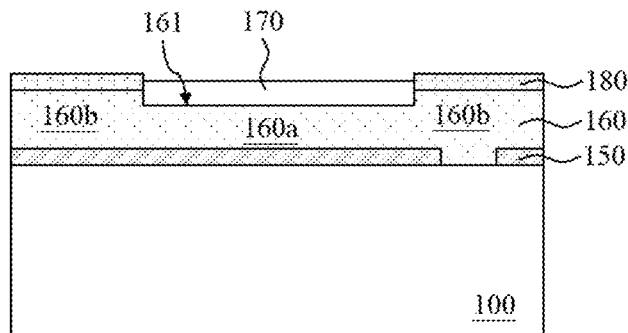
FIG. 2A and FIG. 2B illustrate schematic cross-sectional views of a surface acoustic wave resonator device according to some embodiments of the present disclosure, and are cross-sectional views taken along line A-A' and line B-B' of FIG. 1A, respectively.
Figure 2B:
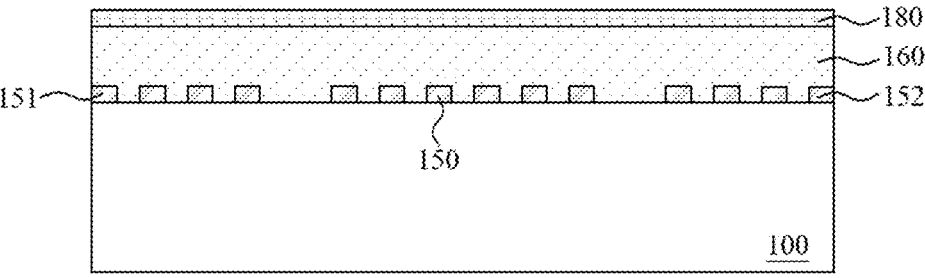

FIG. 1A illustrates a schematic plan view of a surface acoustic wave resonator device according to some embodiments of the present disclosure; FIG. 1B illustrates a schematic enlarged plan view of an interdigital transducer in the surface acoustic wave resonator device illustrated in FIG. 1A according to some embodiments of the present disclosure. FIG. 2A and FIG. 2B illustrate schematic cross-sectional views of a surface acoustic wave resonator device according to some embodiments of the present disclosure, and are cross-sectional views taken along line A-A' and line B-B' of FIG. 1A, respectively.

Referring to FIGS. 1A, 1B, 2A and 2B, in some embodiments, a surface acoustic wave resonator device 500 has an interdigital electrode region IR including a central region C, a first end region E1, a second end region E2, a first peripheral region R1 and a second peripheral region R2; and the surface acoustic wave resonator device 500 includes a piezoelectric substrate 100, an interdigital transducer 150, an intermediate layer 160, an acoustic velocity adjusting layer 170 and a passivation layer 180. For example, the first peripheral region R1, the first end region E1, the central region C, the second end region E2 and the second peripheral region R2 are sequentially arranged in the first direction D1.

In some embodiments, the interdigital transducer 150 is disposed on the piezoelectric substrate 100, and includes a plurality of interdigital electrodes as well as a first bus bar 111 and a second bus bar 121. For example, the plurality of interdigital electrodes are located in the interdigital electrode region IR, and include first interdigital electrodes 110 and second interdigital electrodes 120; the plurality of interdigital electrodes extend substantially parallel to each other in a first direction D1 and are arranged in a second direction D2. The first direction D1 and the second direction D2 are parallel to the main surface of the piezoelectric substrate 100 (e.g., a surface of the piezoelectric substrate close to or in contact with the interdigital transducer 150) and intersect with each other, for example, the first direction D1 and the second direction D2 are substantially perpendicular to each other. For example, the first interdigital electrodes 110 and the second interdigital electrodes 120 extend in the first direction D1 and are alternately arranged in the second direction D2.

The first bus bar 111 and the second bus bar 121 are located on opposite sides of the interdigital electrode region IR in the first direction D1, and are connected to the first interdigital electrodes 110 and the second interdigital electrodes 120, respectively. The first interdigital electrode 110 extends from the first peripheral region R1 to the second end region E2, and the second interdigital electrode 120 extends from the second peripheral region R2 to the first end region E1. That is, the first interdigital electrode 110 continuously extends in the first peripheral region R1, the first end region E1, the central region C and the second end region E2; the second interdigital electrode 120 continuously extends in the second peripheral region R2, the second end region E2, the central region C and the first end region E1. The first interdigital electrode 110 is not disposed in the second peripheral region R2, and is spaced apart from the second bus bar 121 by the second peripheral region R2. The second interdigital electrode 120 is not disposed in the first peripheral region R1, and is spaced apart from the first bus bar 111 by the first peripheral region R1.

In some embodiments, the intermediate layer 160 is disposed on the piezoelectric substrate 100 and covers the interdigital transducer 150, that is, the intermediate layer 160 is disposed on a side of the piezoelectric substrate 100 having the interdigital transducer 150. For example, the intermediate layer 160 covers sidewalls and surfaces at a side away from the piezoelectric substrate 100 of the plurality of interdigital electrodes, the first bus bar and the second bus bar of the interdigital transducer 150.

In some embodiments, the surface acoustic wave resonator device 500 may be or include a temperature compensated surface acoustic wave (TC-SAW) resonator device, and the intermediate layer 160 may include a temperature compensation layer. For example, at least part of the intermediate layer 160 may be a temperature compensation layer. In some embodiments, the intermediate layer 160 may only include a temperature compensation layer; in some embodiments, the intermediate layer 160 may further include a protection layer located on a side of the temperature compensation layer close to the piezoelectric substrate, the protection layer separates the temperature compensation layer from the interdigital transducer, thereby protecting the interdigital transducer against oxidation during the formation of the temperature compensation layer.

For example, the intermediate layer 160 may include one or more of materials such as silicon oxide ($SiO_2$), silicon nitride (SiN), aluminum nitride (AlN), amorphous silicon, gallium nitride and the like. The intermediate layer 160 may be a single-layer structure or a multi-layer structure, for example, the intermediate layer 160 may have a single-layer structure and may include a silicon oxide material; alternatively, the intermediate layer 160 may have a multi-layer structure, and may include a stack of a silicon oxide layer and a non-silicon-oxide layer formed of a material such as silicon nitride (SiN), aluminum nitride (AlN), amorphous silicon, gallium nitride or the like, wherein the non-silicon-oxide layer is at least disposed between the silicon oxide layer and the interdigital transducer, or may further be disposed between the silicon oxide layer and the piezoelectric substrate. The thickness of the silicon oxide layer may be much larger than that of the non-silicon-oxide layer, and the silicon oxide layer is used as the temperature compensation layer. The non-silicon-oxide layer can protect the interdigital transducer against oxidation during the formation of the silicon oxide layer, that is, the non-silicon-oxide layer can be used as the protection layer.

In some embodiments, the acoustic velocity adjusting layer 170 is disposed on a side of at least part of the intermediate layer 160 away from the piezoelectric substrate 100. The passivation layer 180 is disposed on a side of the intermediate layer 160 away from the piezoelectric substrate. For example, the acoustic velocity adjusting layer 170 is located in the central region C, and overlaps with portions of the plurality of interdigital electrodes located in the central region C in the direction perpendicular to the main surface of the piezoelectric substrate 100 (e.g., the third direction D3), and is configured to change the acoustic velocity in the central region C. For example, the acoustic velocity adjusting layer 170 is configured to accelerate the acoustic velocity in the central region C, so that the acoustic velocity in the central region C is different from (e.g., higher than) the acoustic velocity in the first end region E1 and the acoustic velocity in the second end region E2, that is, there is an acoustic velocity difference between the central region and the end regions. In the present disclosure, the "acoustic velocity" in a certain region refers to the propagation speed of acoustic wave in this region; multiple components being overlapped in a certain direction represents that orthographic projections of the multiple components on a reference plane perpendicular to this certain direction are overlapped with each other. That is, the orthographic projection of the acoustic velocity adjusting layer 170 on the main surface of the piezoelectric substrate 100 overlaps with the orthographic projections of a plurality of interdigital electrodes on the main surface of the piezoelectric substrate. In some embodiments, the orthographic projections, on the piezoelectric substrate, of the portions of the plurality of interdigital electrodes located in the central region may be located within the orthographic projection of the acoustic velocity adjusting layer on the piezoelectric substrate.

It should be understood that in the present disclosure, the interdigital electrode region not only includes the layer where the interdigital electrodes are located, but also includes the layer overlapping with the interdigital transducer in the direction perpendicular to the main surface of the piezoelectric substrate; moreover, the interdigital electrode region not only includes the interdigital region where various interdigital electrodes are located and the region overlapping with the interdigital region in the direction perpendicular to the main surface of the piezoelectric substrate, but also includes the region between a plurality of interdigital electrodes, the region between the interdigital electrodes and the bus bar, and the region overlapping with the above-mentioned regions in the direction perpendicular to the main surface of the piezoelectric substrate.

Referring to FIG. 1B, in the interdigital electrode region, in the first direction D1, the first end region E1 and the second end region E2 are located on opposite two sides of the central region C. The first peripheral region R1 is located at a side of the first end region E1 away from the central region C, and the second peripheral region R2 is located at a side of the second end region E2 away from the central region C. The first end region and the second end region may be collectively referred to as end regions or interdigital electrode end regions; the first peripheral region and the second peripheral region may be collectively referred to as peripheral regions or interdigital electrode peripheral regions; the central region may also be referred to as interdigital electrode central region or interdigital electrode active region.

For example, each interdigital electrode among the plurality of interdigital electrodes includes a central part, a first end part, a second end part and a connecting part; the central part is located in the central region, the first end part is located in one of the first and second end regions, the second end part is located in the other one of the first and second end regions, and the connecting part is located in one of the first and second peripheral regions. In each interdigital electrode, the first end part and the second end part are located at opposite sides of the central part in the first direction; and the connecting part is located at a side of the first end part away from the central part, and is connected with the first end part and a corresponding bus bar.

For example, the central part 10, the first end part 11, the second end part 12 and the connecting part 13 of the first interdigital electrode 110 are located in the central region C, the first end region E1, the second end region E2 and the first peripheral region R1, respectively; the central part 20, the first end part 21, the second end part 22 and the connecting part 23 of the second interdigital electrode 120 are located in the central region C, the second end region E2, the first end region E1 and the second peripheral region R2, respectively. The portions of the plurality of interdigital electrodes located in the central region include the central parts 10 of the first interdigital electrodes 110 and the central parts 20 of the second interdigital electrodes 120, that is, the orthographic projections of the central parts 10 of the first interdigital electrodes 110 and the central parts 20 of the second interdigital electrodes 120 on the piezoelectric substrate are located within the orthographic projection of the acoustic velocity adjusting layer 170 on the piezoelectric substrate 100. The first end part 11 and the second end part 12 of the first interdigital electrode 110 together constitute the end portion of the first interdigital electrode; and the first end part 21 and the second end part 22 of the second interdigital electrode 120 together constitute the end portion of the second interdigital electrode.

In some embodiments, portions of the plurality of interdigital electrodes located in other regions of the interdigital electrode region other than the central region do not overlap with the acoustic velocity adjusting layer. For example, the orthographic projections of the portions of the plurality of interdigital electrodes located in the first end region, the second end region, the first peripheral region and the second peripheral region on the piezoelectric substrate are offset from (i.e., not overlapped with) the orthographic projection of the acoustic velocity adjusting layer on the piezoelectric substrate. In the present disclosure, the orthographic projections of multiple components on a certain reference plane being offset includes the case that the orthographic projections of the multiple components are spaced apart from each other and are not overlapped with each other, and also includes the case that the orthographic projections of the multiple components border each other but are not overlapped with each other.

For example, the orthographic projections of the first end parts 11, the second end parts 12 and the connecting parts 13 of a plurality of first interdigital electrodes 110, and the first end parts 21, the second end parts 22 and the connecting parts 23 of a plurality of second interdigital electrodes 120 on the piezoelectric substrate 100 are offset from the orthographic projection of the acoustic velocity adjusting layer 170 on the piezoelectric substrate 100. For example, the orthographic projections of the first bus bar 111 and the second bus bar 121 of the interdigital transducer 150 on the piezoelectric substrate are also not overlapped with the orthographic projection of the acoustic velocity adjusting layer 170 on the piezoelectric substrate.

In some embodiments, the acoustic velocity adjusting layer 170 has a first sidewall and a second sidewall opposite to each other in the second direction D2; the first sidewall and the second sidewall extend along the first direction D1, and may be each aligned with the outer sidewall, away from other interdigital electrodes, of an interdigital electrode (the first interdigital electrode or the second interdigital electrode) located at the outermost side in the second direction D2 among a plurality of interdigital electrodes. For example, as illustrated in FIG. 1B, the first sidewall of the acoustic velocity adjusting layer 170 may be substantially aligned, in a third direction D3 perpendicular to the main surface of the piezoelectric substrate, with the outer sidewall of the first interdigital electrode 110 located at the outermost side; the second sidewall of the acoustic velocity adjusting layer 170 may be substantially aligned, in the third direction D3 perpendicular to the main surface of the piezoelectric substrate, with the outer sidewall of the second interdigital electrode 120 located at the outermost side.

In an alternative embodiment, the acoustic velocity adjusting layer may also extend, in the second direction, beyond one or both of the outer sidewalls of the outermost two interdigital electrodes among the plurality of interdigital electrodes. For example, the acoustic velocity adjusting layer 170 may extend, in the second direction D2, beyond the outer sidewall of the first interdigital electrode 110 located at the outermost side, which is away from other interdigital electrodes; and/or, the acoustic velocity adjusting layer 170 may extend beyond the outer sidewall, away from other interdigital electrodes, of the second interdigital electrode 120 located at the outermost side, in the second direction D2.

For example, the acoustic velocity adjusting layer 170 is configured to change the acoustic velocity in the region where it is located, for example, to accelerate the acoustic velocity in the region where it is located. Therefore, an acoustic velocity difference can be made between the region where the acoustic velocity adjusting layer is provided and the region where the acoustic velocity adjusting layer is not provided. For example, by providing the acoustic velocity adjusting layer in the interdigital electrode central region, while not providing the acoustic velocity adjusting layer in other regions such as the interdigital electrode end region, the acoustic velocity in the interdigital electrode central region can be higher than the acoustic velocity in other regions such as the interdigital electrode end region. For example, the acoustic velocity adjusting layer 170 may also be referred to as a high acoustic velocity layer, and the region where the layer is disposed (e.g., the central region) may also be referred to as a high acoustic velocity region.

In some embodiments, the acoustic velocity adjusting layer 170 may include a material different from that of the intermediate layer 160. For example, the intermediate layer 160 includes a temperature compensation layer, and the acoustic velocity adjusting layer 170 and the temperature compensation layer include different materials. For example, the acoustic velocity adjusting layer 170 includes silicon nitride (SiNx), aluminum nitride, or a combination thereof. The passivation layer 180 may include a material the same as or different from the material of the acoustic velocity adjusting layer 170. For example, the passivation layer 180 may include silicon oxide ($SiO_2$), silicon nitride (SiNx) or a combination thereof.

In some embodiments, the intermediate layer has a recess, and at least a portion of the acoustic velocity adjusting layer is located in the recess of the intermediate layer. The passivation layer may or may not cover the surface of the acoustic velocity adjusting layer at a side away from the intermediate layer. For example, the passivation layer may be located in a region outside the recess of the intermediate layer without covering the acoustic velocity adjusting layer. The orthographic projection of the acoustic velocity adjusting layer on the piezoelectric substrate may be offset from the orthographic projection of the passivation layer on the piezoelectric substrate. In some other embodiments, the passivation layer may further cover the surface of the acoustic velocity adjusting layer at a side away from the piezoelectric substrate.

In the embodiment where the intermediate layer has a recess, the thickness of the acoustic velocity adjusting layer in the direction perpendicular to the main surface of the piezoelectric substrate may be the same as or different from the height of the recess in the direction perpendicular to the main surface of the piezoelectric substrate. For example, the thickness of the acoustic velocity adjusting layer may be substantially equal to the height of the recess; in this example, the surface of the acoustic velocity adjusting layer at a side away from the piezoelectric substrate may be substantially level, in the direction parallel to the main surface of the piezoelectric substrate, with the surface of the intermediate layer at a side away from the piezoelectric substrate. In some other embodiments, the thickness of the acoustic velocity adjusting layer may be greater than or smaller than the height of the recess; in this example, in the direction perpendicular to the main surface of the piezoelectric substrate, the distance between the surface of the acoustic velocity adjusting layer at a side away from the piezoelectric substrate and the main surface of the piezoelectric substrate is greater than or less than the distance between the surface (e.g., the surface in contact with the passivation layer) of the intermediate layer at a side away from the piezoelectric substrate and the main surface of the piezoelectric substrate.

For example, referring to FIG. 2A, the intermediate layer 160 has a recess 161, and the thickness of the acoustic velocity adjusting layer 170 may be greater than the height of the recess 161 of the intermediate layer 160. For example, a portion of the acoustic velocity adjusting layer 170 is located in the recess 161, and the acoustic velocity adjusting layer 170 has a protruding part protruded from the surface of the intermediate layer 160 at the side farthest from the piezoelectric substrate 100 in the direction perpendicular to the main surface of the piezoelectric substrate 100. In this example, in the direction perpendicular to the main surface of the piezoelectric substrate, the distance between the surface of the acoustic velocity adjusting layer 170 at a side away from the piezoelectric substrate and the main surface of the piezoelectric substrate is greater than the distance between the surface of the intermediate layer 160 at a side away from (i.e., farthest away from) the piezoelectric substrate and the main surface of the piezoelectric substrate. The sidewall of the protruding part of the acoustic velocity adjusting layer 170 may be in contact with the passivation layer 180.

In some embodiments, the orthographic projection of the acoustic velocity adjusting layer 170 on the piezoelectric substrate 100 is located within a range of orthographic projection of the recess 161 of the intermediate layer 160 on the piezoelectric substrate 100. For example, the orthographic projection of the acoustic velocity adjusting layer 170 may substantially coincide with the orthographic projection of the recess 161, and the area of the orthographic projection of the acoustic velocity adjusting layer 170 may be substantially equal to the area of the orthographic projection of the recess 161.

In some embodiments, the passivation layer 180 overlies the region other than the recess of the intermediate layer 160. In this example, the surface of the acoustic velocity adjusting layer 170 at a side away from the piezoelectric substrate 100 may not be covered by the passivation layer 180; the orthographic projection of the acoustic velocity adjusting layer 170 on the piezoelectric substrate 100 is offset from the orthographic projection of the passivation layer 180 on the piezoelectric substrate 100. For example, the acoustic velocity adjusting layer 170 and the recess 160 are disposed in the central region of the interdigital electrode region, while the passivation layer 180 is disposed in other regions except the interdigital electrode central region.

Still referring to FIG. 2A, in other words, the intermediate layer 160 may include a first portion 160a and a second portion 160b, the first portion 160a has a first thickness and the second portion 160b has a second thickness, and the first thickness is smaller than the second thickness. Here, the first thickness and the second thickness of the intermediate layer both are thicknesses of the portions in the direction perpendicular to the main surface of the piezoelectric substrate. The recess 161 is defined by the surface of the first portion 160a of the intermediate layer 160 at a side away from the piezoelectric substrate and the sidewall of the second portion 160b. The acoustic velocity adjusting layer 170 and the passivation layer 180 cover the first portion 160a and the second portion 160b of the intermediate layer 160, respectively. In some embodiments, the recess 161 is provided in the interdigital electrode central region, and does not extend into the interdigital electrode end region and the interdigital electrode peripheral region. That is, the first portion 160a with a smaller thickness is located in the interdigital electrode central region, but not in the interdigital electrode end regions and the interdigital electrode peripheral regions; the second portion 160b with a larger thickness may be located in the interdigital electrode end regions and the interdigital electrode peripheral regions.

In some embodiments, the acoustic velocity adjusting layer 170 includes silicon nitride, aluminum nitride or a combination thereof; the passivation layer 180 includes silicon oxide, silicon nitride or a combination thereof. The acoustic velocity adjusting layer 170 and the passivation layer 180 include the same or different materials. In some examples, in the case that the passivation layer 180 also includes silicon nitride, the thickness of the acoustic velocity adjusting layer 170 may be set to be greater than (e.g., much greater than) the thickness of the passivation layer 180, so that the effect of acoustic velocity adjusting layer 170 to accelerate the acoustic velocity in the interdigital electrode central region is greater than (e.g., much greater than) the effect of the passivation layer 180 to accelerate the acoustic velocity in other regions of the interdigital electrode, so that the acoustic velocity in the interdigital electrode central region is greater than that in other regions of the interdigital electrode (e.g., the first end region and the second end region), that is, an acoustic velocity difference still exists between the interdigital electrode central region and the interdigital electrode end regions.

In some embodiments, the recess of the intermediate layer 161 is disposed in its temperature compensation layer (e.g., silicon oxide layer). By disposing the recess in the intermediate layer, the thickness of the first portion of the intermediate layer is reduced, for example, the thickness of the temperature compensation layer is reduced. For example, reducing the thickness of the first portion of the intermediate layer can also be beneficial to accelerate the acoustic velocity in this region. For example, the material of the temperature compensation layer (e.g., silicon oxide) may slow down the acoustic velocity, therefore, the effect of accelerating the acoustic velocity in this region can also be achieved by forming a recess in the temperature compensation layer to reduce the thickness thereof. That is to say, by disposing the recess in the intermediate layer and disposing the acoustic velocity adjusting layer in the recess of the intermediate layer, the acoustic velocity in the central region can be further accelerated, and the acoustic velocity difference between the central region and the end regions can be increased, which is more conducive to improving the clutter suppression effect.

FIG. 3A to FIG. 3H illustrate schematic cross-sectional views of a surface acoustic wave resonator device taken along line A-A' of FIG. 1A according to some other embodiments of the present disclosure.

Figure 3A:
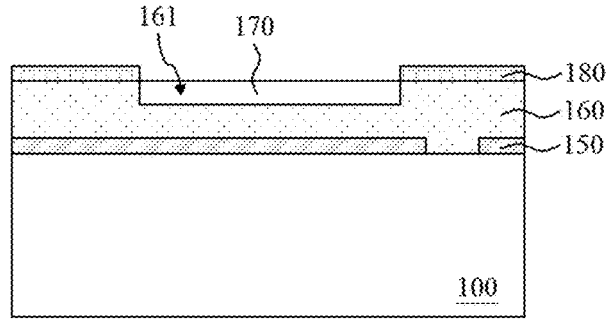
FIG. 3A to FIG. 3H illustrate schematic cross-sectional views of a surface acoustic wave resonator device taken along line A-A' of FIG. 1A according to some alternative embodiments of the present disclosure.

Referring to FIG. 3A, in some embodiments, the acoustic velocity adjusting layer 170 is located in the recess 161 of the intermediate layer 160, and the thickness of the acoustic velocity adjusting layer 170 may be substantially equal to the depth of the recess 161 of the intermediate layer 160. For example, the acoustic velocity adjusting layer 170 may be just completely located in the recess 161 of the intermediate layer 160, and the surface of the acoustic velocity adjusting layer 170 at a side away from the piezoelectric substrate 100 may be substantially level, in the direction parallel to the main surface of the piezoelectric substrate, with the surface of the intermediate layer 160 at a side away from the piezoelectric substrate 100.

Figure 3B:
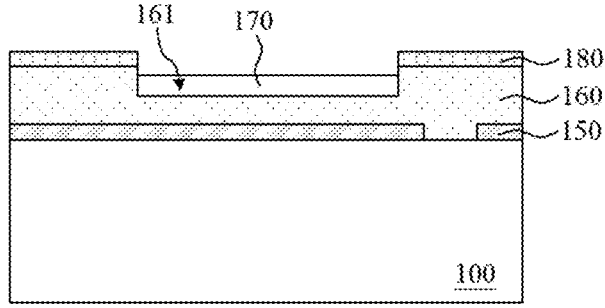

Referring to FIG. 3B, in some embodiments, the acoustic velocity adjusting layer 170 is located in the recess 161 of the intermediate layer 160, and the thickness of the acoustic velocity adjusting layer 170 may be smaller than the depth of the recess 161 of the intermediate layer 160. For example, the acoustic velocity adjusting layer 170 is completely located in the recess 161 of the intermediate layer 160; and with relative to the main surface of the piezoelectric substrate 100, the surface of the acoustic velocity adjusting layer 170 at a side away from the piezoelectric substrate is lower than the surface of the intermediate layer 160 (e.g., the second portion thereof) at a side away from the piezoelectric substrate. That is, in the direction perpendicular to the main surface of the piezoelectric substrate, the distance between the surface of the acoustic velocity adjusting layer 170 at a side away from the piezoelectric substrate and the main surface of the piezoelectric substrate is less than the distance between the surface of the intermediate layer 160 at a side away from the piezoelectric substrate and the main surface of the piezoelectric substrate.

In the examples of FIG. 3A and FIG. 3B, the surface of the acoustic velocity adjusting layer 170 at a side away from the piezoelectric substrate may not be covered by the passivation layer 180, and the relative positional relationship and structural features of the acoustic velocity adjusting layer 170 and the passivation layer 180 are similar to those described in the previous embodiment with reference to FIG. 2A, and will not be described here again.

Figure 3C:
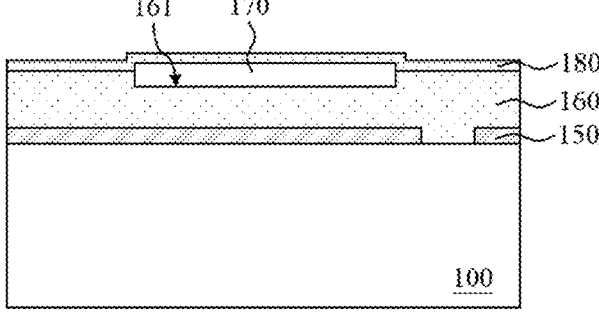
Figure 3D:
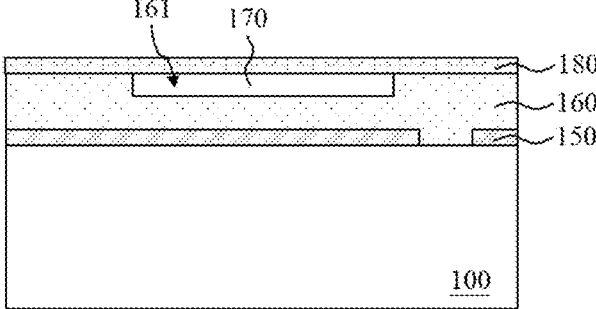
Figure 3E:
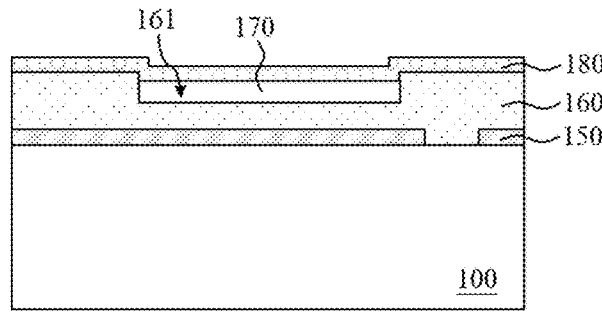

Referring to FIG. 3C to FIG. 3E, in some embodiments, at least a portion of the acoustic velocity adjusting layer 170 is located in the recess 161 of the intermediate layer 160, and the surface of the acoustic velocity adjusting layer 170 at a side away from the piezoelectric substrate may be covered by the passivation layer 180. For example, the passivation layer 180 may extend continuously on the intermediate layer 160 and the acoustic velocity adjusting layer 170, and cover the surfaces of the intermediate layer 160 and the acoustic velocity adjusting layer 170 at a side away from the piezoelectric substrate. In this example, the thickness of the acoustic velocity adjusting layer 170 may be greater than, substantially equal to or smaller than the depth of the recess 161 in the intermediate layer 160. FIG. 3C illustrates an example in which the thickness of the acoustic velocity adjusting layer 170 is greater than the depth of the recess, wherein the passivation layer 180 covers the surface of the acoustic velocity adjusting layer 170 at a side away from the piezoelectric substrate, and covers the sidewall of the protruding part of the acoustic velocity adjusting layer 170. In an alternative embodiment, as illustrated in FIG. 3D, the thickness of the acoustic velocity adjusting layer 170 may also be substantially equal to the depth of the recess, so that the surfaces of the acoustic velocity adjusting layer 170 and the intermediate layer 160 at a side away from the piezoelectric substrate are substantially level with each other, and that the passivation layer 180 overlies the acoustic velocity adjusting layer 170 and the intermediate layer 160 and may have a substantially flat surface.

In some other alternative embodiments, as illustrated in FIG. 3E, the thickness of the acoustic velocity adjusting layer 170 may also be smaller than the depth of the recess, and the passivation layer 180 covers the intermediate layer 160 and may further extend into the recess to fill the portion of the recess that is not filled by the acoustic velocity adjusting layer; a portion of the passivation layer 180 covers the surface of the acoustic velocity adjusting layer 170 at a side away from the piezoelectric substrate, and may cover a portion of the sidewall of the recess.

Figure 3F:
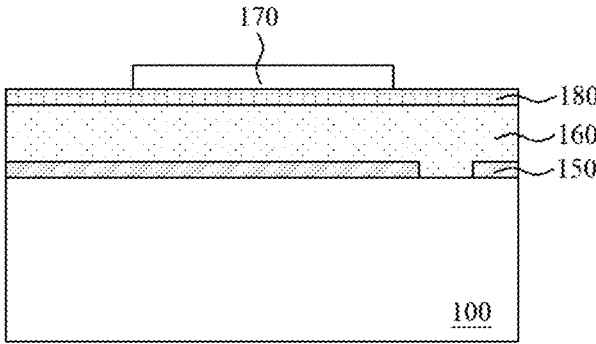

Referring to FIG. 3F, in some other embodiments, the acoustic velocity adjusting layer 170 may also be disposed on a side of the passivation layer 180 away from the piezoelectric substrate and cover a portion of the surface of the passivation layer 180. For example, the passivation layer 180 extends continuously on the intermediate layer 160 and may substantially cover the entire surface of the intermediate layer 160. The acoustic velocity adjusting layer 170 covers the portion of the passivation layer 180 located in the central region of the interdigital electrode region, and the acoustic velocity adjusting layer 170 and the intermediate layer 160 are spaced apart from each other by a portion of the passivation layer 180 located therebetween.

Figure 3G:
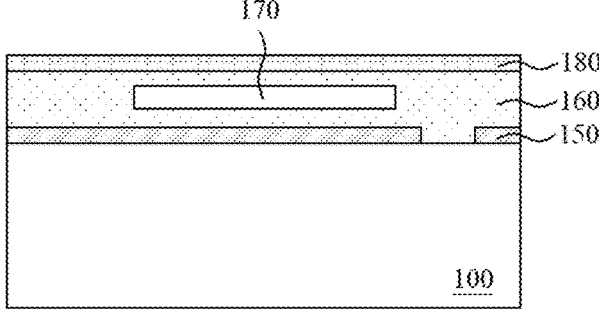

Referring to FIG. 3G, in some other embodiments, the acoustic velocity adjusting layer 170 may be buried in the intermediate layer 160, and the surface of the acoustic velocity adjusting layer 170 at a side away from the piezoelectric substrate 100 may be covered by the intermediate layer 160. For example, the intermediate layer 160 may include a first intermediate sub-layer and a second intermediate sub-layer, and the acoustic velocity adjusting layer 170 is disposed on a side of the first intermediate sub-layer away from the piezoelectric substrate 100; the second intermediate sub-layer is disposed on a side of the first intermediate sub-layer away from the piezoelectric substrate, and covers the surface of the first intermediate sub-layer away from the piezoelectric substrate, and covers the sidewall of the acoustic velocity adjusting layer 170 and the surface thereof at a side away from the piezoelectric substrate. In this embodiment, the surface of the acoustic velocity adjusting layer 170 at a side close to the piezoelectric substrate, the surface of the acoustic velocity adjusting layer 170 at a side away from the piezoelectric substrate and the sidewalls of the acoustic velocity adjusting layer 170 are all covered by and in contact with the intermediate layer 160. In some embodiments, the thickness of the intermediate layer 160 in the region where the acoustic velocity adjusting layer is provided can also be substantially reduced by burying the acoustic velocity adjusting layer 170 in the intermediate layer 160.

Figure 3H:
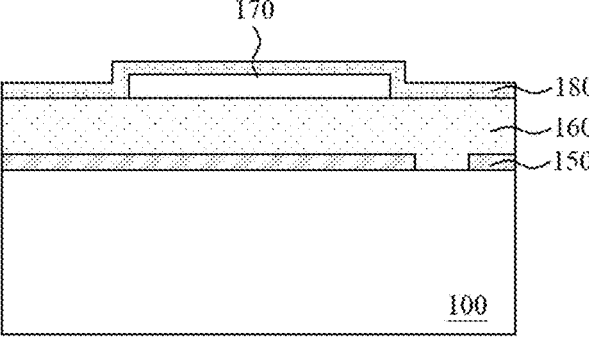

Referring to FIG. 3H, in some embodiments, the acoustic velocity adjusting layer 170 is disposed on a side of the intermediate layer 160 away from the piezoelectric substrate, and there may be free of recess disposed in the intermediate layer 160, that is, the acoustic velocity adjusting layer 170 is located on the top of the intermediate layer 160. The passivation layer 180 is disposed on the side of the intermediate layer 160 away from the piezoelectric substrate, and may cover or may not cover the acoustic velocity adjusting layer 170. For example, as illustrated in FIG. 3H, the passivation layer 180 covers the sidewalls of the acoustic velocity adjusting layer 170 and the surface thereof at a side away from the piezoelectric substrate. In some other examples, the passivation layer 180 may also have an opening similar to that illustrated in FIG. 2A to expose the acoustic velocity adjusting layer 170.

In various embodiments, the passivation layer covers the intermediate layer, thereby protecting the intermediate layer; in the example where the acoustic velocity adjusting layer is not covered by the passivation layer, the acoustic velocity adjusting layer can also be used as the passivation layer to protect the intermediate layer.

It should be understood that in the embodiments illustrated in FIG. 3A to FIG. 3H, the acoustic velocity adjusting layers 170 are completely disposed in the central region of the interdigital electrode region, with the positions and/or thicknesses thereof in the direction perpendicular to the main surface of the piezoelectric substrate are different.

In the embodiment of the present disclosure, the acoustic velocity in the central region is changed by providing the acoustic velocity adjusting layer, so that there is an acoustic velocity difference between the central region and the end regions, thereby achieving the effect of suppressing clutter. For example, during the operation of the surface acoustic wave resonator structure, the surface acoustic wave propagates along the arrangement direction (e.g., the second direction D2) of the plurality of interdigital electrodes of the interdigital transducer 150. However, there may also exist some transverse waves (i.e., spurious acoustic waves, or called clutter) propagating along the extension direction (e.g., the first direction D1) of the interdigital electrodes, and such clutter will lead to energy loss, which in turn will lead to the degradation of performances of the resonator and the filter including the resonator. In the embodiments of the present disclosure, disposing the acoustic velocity adjusting layer can generate a region or an interface where acoustic wave propagation impedance is changed, so as to change (e.g., accelerate) the acoustic velocity in this region, so that there is an acoustic velocity difference between a plurality of regions arranged in the first direction, thereby suppressing or reducing clutter propagating in the first direction D1, avoiding or reducing energy loss, and further improving device performance.

In the embodiment illustrated in FIG. 2A and FIG. 3A to FIG. 3H, the acoustic velocity adjusting layer is disposed in the central region of the interdigital electrode region, so that the propagation rate of acoustic wave in the interdigital electrode central region is higher than that in the end regions of the interdigital electrode region, and an acoustic velocity difference is generated between the central region and the end regions, thereby suppressing the propagation of traverse waves. In the embodiments of FIGS. 2A, 3A-3E and 3G, the acoustic velocity adjusting layer 170 is at least partially embedded in the intermediate layer, for example, the acoustic velocity adjusting layer 170 is disposed in a recess of the intermediate layer, or the whole acoustic velocity adjusting layer 170 is buried in the intermediate layer, so that the intermediate layer has a reduced thickness in the central region of the interdigital electrode region which is provided with the acoustic velocity adjusting layer. In some embodiments, thinning the thickness of the part of the intermediate layer located in the interdigital electrode central region can also be beneficial to accelerate the propagation speed of acoustic wave in the interdigital electrode central region.

That is to say, in these embodiments, through disposing the acoustic velocity adjusting layer 170 to accelerate the acoustic velocity in the interdigital electrode central region, there is an acoustic velocity difference between the central region and the end regions of the interdigital electrode region, and the traverse wave can thus be suppressed. In some embodiments, the thickness of the first portion of the intermediate layer located in the central region of the interdigital electrode region is reduced, which can further accelerate the acoustic velocity in the central region, thereby further increasing the acoustic velocity difference between the central region and the end regions of the interdigital electrode region, which is more conducive to suppressing traverse waves.

Referring back to FIG. 1A and FIG. 1B, in some embodiments, the first bus bar 111 and the second bus bar 121 are located on opposite sides of the interdigital electrode region IR in the first direction D1, and may each extend in the second direction D2. The first bus bar 111 is connected to a plurality of first interdigital electrodes 110, and the second bus bar 121 is connected to a plurality of second interdigital electrodes 120. For example, the first bus bar 111 is located at a side of the plurality of interdigital electrodes 110 in the first direction D1, and is connected with the plurality of first interdigital electrodes 110, so that the plurality of first interdigital electrodes 110 are electrically connected with each other through the first bus bar 111. Similarly, the second bus bar 121 is located at a side of the plurality of second interdigital electrodes 120 in the first direction D1, and is connected with the plurality of second interdigital electrodes 120, so that the plurality of second interdigital electrodes 120 are electrically connected with each other through the second bus bar 121. The first bus bar 111 and the plurality of first interdigital electrodes 110 together constitute a first interdigital electrode structure, and the second bus bar 121 and the plurality of second interdigital electrodes 120 together constitute a second interdigital electrode structure. Each of the first interdigital electrode structure and the second interdigital electrode structure may be integrally formed.

For example, the respective parts of the first interdigital electrode 110 and the first bus bar 111 are connected to each other and can be integrally formed; the respective parts of the second interdigital electrode 120 and the second bus bar 121 are connected to each other and can be integrally formed. A plurality of interdigital electrodes and a plurality of bus bars of the interdigital transducer 150 may be disposed in the same layer.

In some embodiments, the surface acoustic wave resonator device further includes a first reflective grating and a second reflective grating. The first reflective grating and the second reflective grating are disposed on the piezoelectric substrate and arranged on two opposite sides of the interdigital transducer in the second direction. In some embodiments, the orthographic projection of the acoustic velocity adjusting layer on the piezoelectric substrate is offset from the orthographic projections of the first reflective grating and the second reflective grating on the piezoelectric substrate; alternatively, the orthographic projection of the acoustic velocity adjusting layer on the piezoelectric substrate overlaps with the orthographic projections of the first reflective grating and/or the second reflective grating on the piezoelectric substrate.

Referring to FIG. 1A, in some embodiments, the surface acoustic wave resonator device 500 further includes a first reflective grating 151 and a second reflective grating 152. The first reflective grating 151 and the second reflective grating 152 may be disposed in the same layer as the interdigital transducer 150. That is, the respective components of the first reflective grating 151, the second reflective grating 152 and the interdigital transducer 150 may be formed from the same material layer through the same patterning process. For example, the first reflective grating, the second reflective grating, and the interdigital transducer may include metallic materials, including, for example, tungsten (W), platinum (Pt), gold (Au), copper (Cu), zinc (Zn), silver (Ag), molybdenum (Mo), or any combination thereof.

For example, the first reflective grating 151 and the second reflective grating 152 are disposed on two opposite sides of the interdigital transducer 150 in the second direction D2, and each reflective grating includes a plurality of reflective electrodes 52 and a bus bar 53. For example, in each reflective grating, the plurality of reflective electrodes 52 extend substantially parallel to each other along a first direction D1 and are arranged at intervals along a second direction D2, and the bus bar 53 extends along the second direction D2 and is connected to the plurality of reflective electrodes 52. For example, two bus bars 53 are located at two opposite sides of the plurality of reflective electrodes 52 in the first direction D1, and may be substantially parallel to each other and electrically connected to the plurality of reflective electrodes 52. The number of the reflective electrodes 52 in the first reflective grating 151 may be the same as or different from that in the second reflective grating 152. It should be understood that, the number of the interdigital electrodes in the interdigital transducer and the number of the reflective electrodes in the reflective grating illustrated in the figures are only for illustration, and the present disclosure is not limited thereto.

In some embodiments, the acoustic velocity adjusting layer 170 is disposed in the central region of the interdigital electrode region, without extending to the region where the reflective grating is located. For example, the orthographic projection of the acoustic velocity adjusting layer 170 on the piezoelectric substrate is offset from the orthographic projections of the first and second reflective gratings on the piezoelectric substrate. In some other embodiments, the acoustic velocity adjusting layer 170 may further extend into the region where the reflective grating is located.

In some embodiments, the surface acoustic wave resonator device further includes a first protruding structure disposed in the first end region and the second end region of the interdigital electrode region, and the first protruding structure is configured to change the acoustic velocity in the first end region and the second end region. In some embodiments, the first protruding structure may be configured to reduce the acoustic velocity in the first end region and the second end region. In some embodiments, the orthographic projection of the acoustic velocity adjusting layer on the piezoelectric substrate is offset from the orthographic projection of the protruding structure on the piezoelectric substrate. For example, the first protruding structure may be disposed at the same layer as the interdigital transducer, or the first protruding structure may be disposed on a side of the interdigital transducer away from the intermediate layer.

In some embodiments, the first protruding structure includes a plurality of first mass loading blocks respectively disposed on a side, away from the piezoelectric substrate, of the end parts of the plurality of interdigital electrodes located in the first end region and the second end region. For example, the plurality of first mass loading blocks may be a plurality of metal blocks. For example, each first mass loading block and an end part of a corresponding interdigital electrode overlap with each other in the direction perpendicular to the main surface of the piezoelectric substrate, and have sidewalls aligned with each other in the direction perpendicular to the main surface of the piezoelectric substrate. In this embodiment, the first mass loading block of the first protruding structure protrudes from the surface of the interdigital transducer (e.g., the central part of the interdigital electrode) at a side away from the piezoelectric substrate in the direction perpendicular to the main surface of the piezoelectric substrate.

Figure 4A:
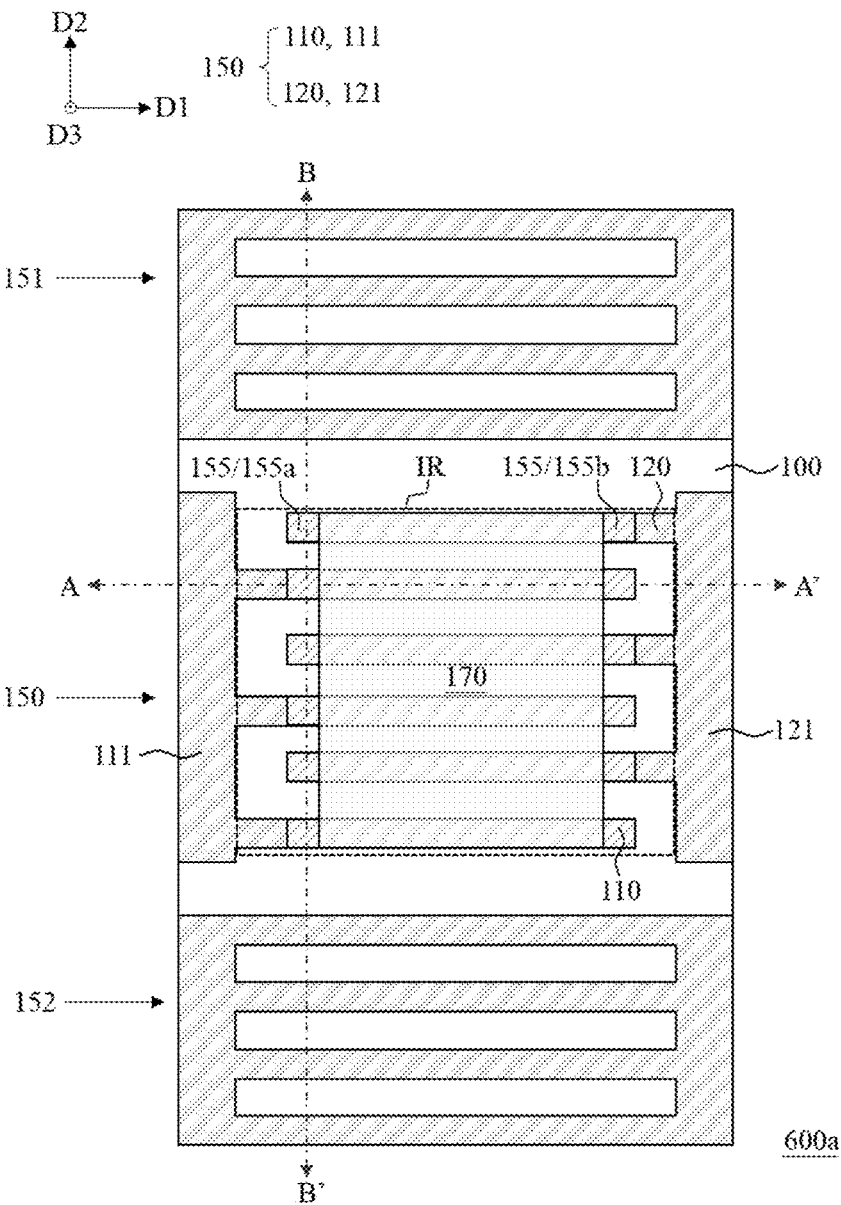
FIG. 4A illustrates a schematic plan view of a surface acoustic wave resonator device according to some other embodiments of the present disclosure.
Figure 4B:
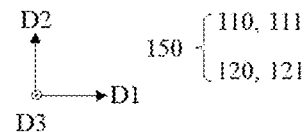
FIG. 4B illustrates a schematic enlarged plan view of an interdigital transducer in the surface acoustic wave resonator device illustrated in FIG. 4A according to some other embodiments of the present disclosure.
Figure 4B:
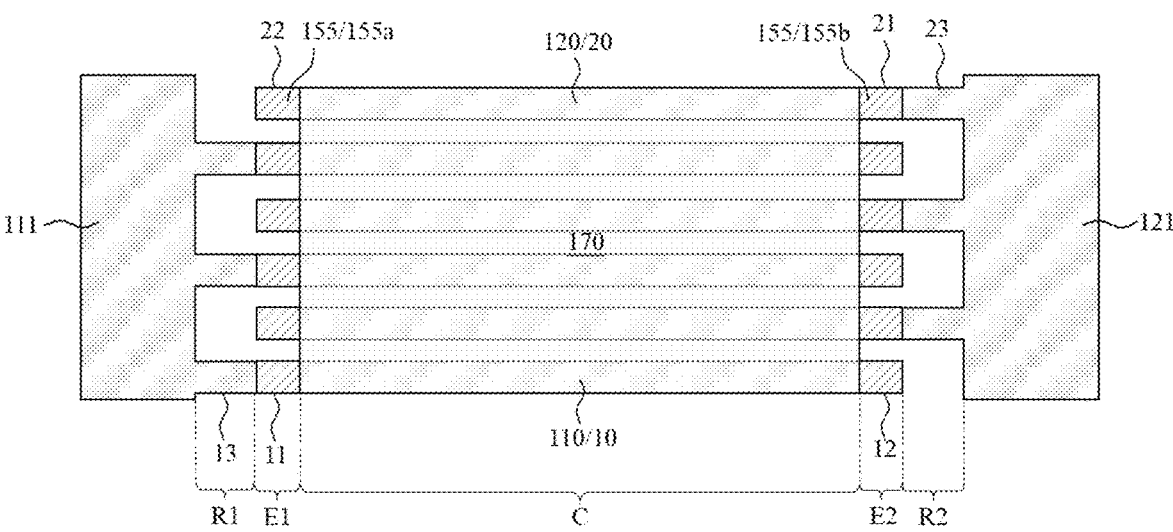
Figure 5A:
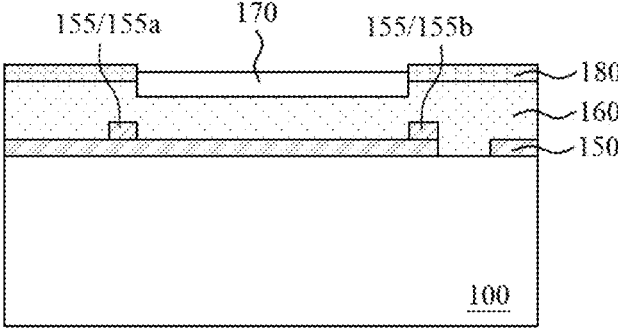
FIG. 5A and FIG. 5B illustrate schematic cross-sectional views of a surface acoustic wave resonator device according to some other embodiments of the present disclosure, and are cross-sectional views taken along line A-A' and line B-B' of FIG. 4A, respectively.
Figure 5B:
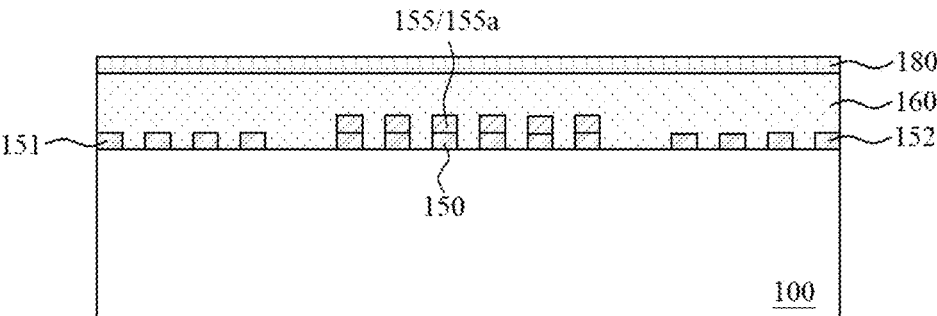
Figure 6A:
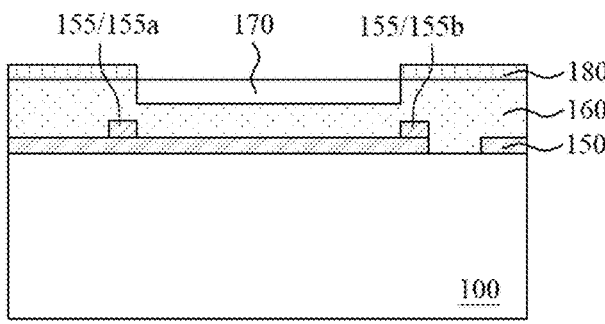
FIG. 6A to FIG. 6H illustrate schematic cross-sectional views of a surface acoustic wave resonator device according to some alternative embodiments of the present disclosure, taken along line A-A' of FIG. 4A.
Figure 6B:
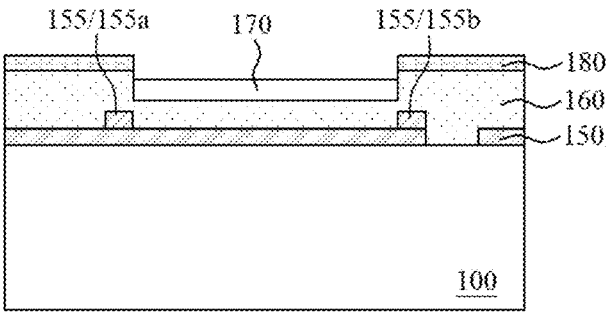
Figure 6C:
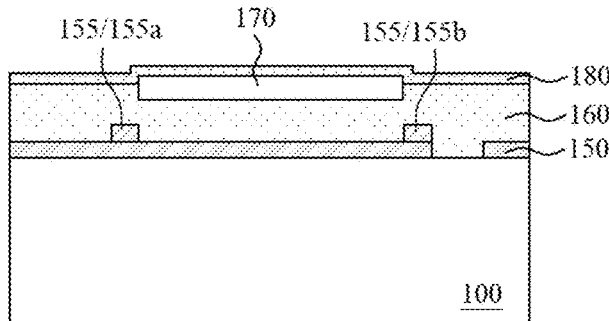
Figure 6D:
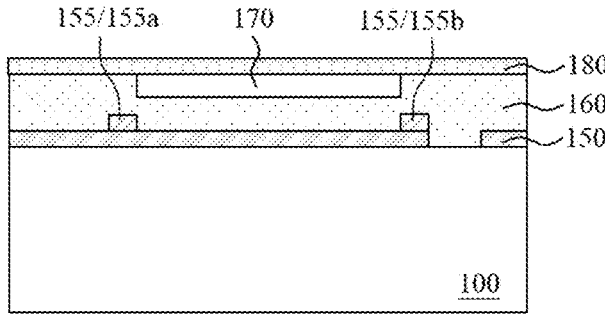
Figure 6E:
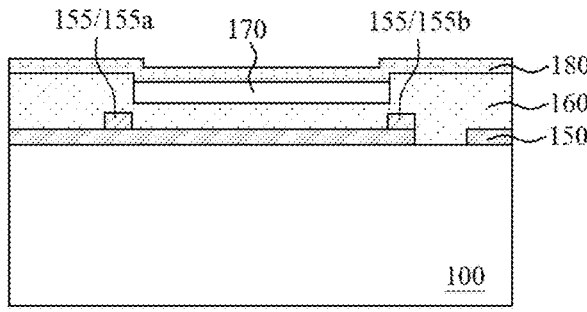
Figure 6F:
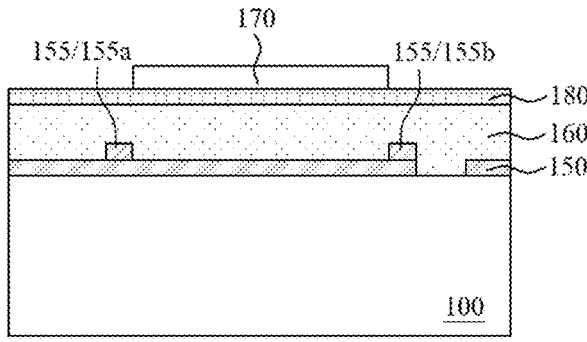
Figure 6G:
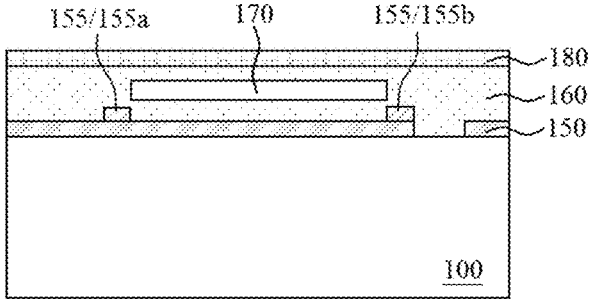
Figure 6H:
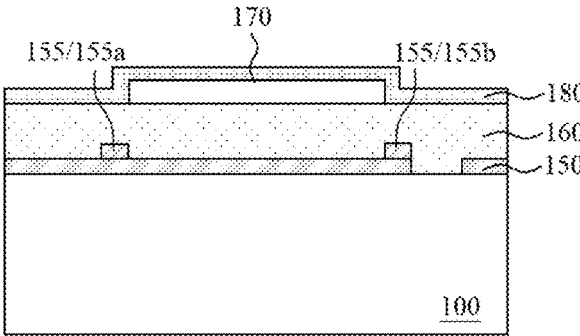

FIG. 4A illustrates a schematic plan view of a surface acoustic wave resonator device 600a according to some other embodiments of the present disclosure; FIG. 4B illustrates a schematic enlarged plan view of an interdigital transducer in the surface acoustic wave resonator device illustrated in FIG. 4A according to some other embodiments of the present disclosure. FIG. 5A and FIG. 5B illustrate schematic cross-sectional views of a surface acoustic wave resonator device according to some other embodiments of the present disclosure, and are cross-sectional views taken along line A-A' and line B-B' of FIG. 4A, respectively. The surface acoustic wave resonator device 600a is similar to the surface acoustic wave resonator device 500, and the difference lies in that the surface acoustic wave resonator device 600a further includes a first protruding structure disposed in the interdigital electrode end region.

Referring to FIGS. 4A, 4B, 5A and 5B, in some embodiments, a first protruding structure 155 is further disposed in the first end region E1 and the second end region E2 of the interdigital electrode region, and the first protruding structure 155 may include a plurality of mass loading blocks, which are respectively provided corresponding to (e.g., in one-to-one correspondence with) the end parts (i.e., the first end parts and the second end parts) of a plurality of interdigital electrodes. The plurality of mass loading blocks overlap with the end parts of the plurality of interdigital electrodes respectively in the direction perpendicular to the main surface of the piezoelectric substrate. For example, the plurality of mass loading blocks are respectively disposed on the side of the end parts of the plurality of interdigital electrodes away from the piezoelectric substrate, and covers and contacts the surfaces of the end parts of the plurality of interdigital electrodes away from the piezoelectric substrate.

For example, the first protruding structure 155 includes a plurality of mass loading blocks 155a located in the first end region E1 and a plurality of mass loading blocks 155b located in the second end region E2. The plurality of mass loading blocks 155a are respectively disposed on a side of the first end parts 11 of the plurality of first interdigital electrodes 110 and the second end parts 22 of the plurality of second interdigital electrodes 120 away from the piezoelectric substrate 100, and covers and contacts the surfaces of these end parts of the plurality of interdigital electrodes at a side away from the piezoelectric substrate 100. The plurality of mass loading blocks 155a are arranged at intervals in the second direction D2, and may be disposed in one-to-one correspondence with the plurality of end parts of the plurality of interdigital electrodes located in the first end region E1; that is, each mass loading block 155a is disposed on one interdigital electrode end part among the first end parts 11 of the first interdigital electrodes 110 and the second end parts 22 of the second interdigital electrodes 120, and each of the first end parts 11 of the first interdigital electrodes 110 and the second end parts 22 of the second interdigital electrodes 120 is provided with one mass loading block 155a disposed thereon.

The plurality of mass loading blocks 155b are respectively disposed on a side of the second end parts 12 of the plurality of first interdigital electrodes 110 and the first end parts 21 of the plurality of second interdigital electrodes 120 away from the piezoelectric substrate 100, and covers and contacts the surfaces of these end parts of the plurality of interdigital electrodes away from the piezoelectric substrate 100. The plurality of mass loading blocks 155b are arranged at intervals in the second direction D2, and may be disposed in one-to-one correspondence with the plurality of end parts of the plurality of interdigital electrodes located in the second end region E2; that is, each mass loading block 155b is disposed on one interdigital electrode end part among the second end parts 12 of the first interdigital electrodes 110 and the first end parts 21 of the second interdigital electrodes 120, and each of the second end parts 12 of the first interdigital electrodes 110 and the first end parts 21 of the second interdigital electrodes 120 is provided with one mass loading block 155b disposed thereon. The mass loading blocks 155a and 155b may be collectively referred to as a first mass loading block.

In some embodiments, among the mass loading blocks and the interdigital electrode end parts disposed in correspondence with each other, the mass loading block and the corresponding interdigital electrode end part overlap in the direction perpendicular to the main surface of the piezoelectric substrate and may have sidewalls that are substantially aligned in the direction perpendicular to the main surface of the piezoelectric substrate. For example, the size (width, area, etc.) of the mass loading block may be substantially the same as that of the corresponding interdigital electrode end part; for example, the orthographic projection of the mass loading block on the piezoelectric substrate may be substantially coincident with the orthographic projection of the corresponding interdigital electrode end part on the piezoelectric substrate.

In some embodiments, the surface of the first protruding structure 155 at a side close to the piezoelectric substrate is in contact with the interdigital electrode end parts, and the sidewalls of the first protruding structure 155 and the surface thereof at a side away from the piezoelectric substrate are covered by and in contact with the intermediate layer 160.

In some embodiments, the orthographic projection of the acoustic velocity adjusting layer 170 on the piezoelectric substrate may border, without overlapping with, the orthographic projections of the plurality of mass loading blocks of the first protruding structure 155 on the piezoelectric substrate.

In this embodiment, the acoustic velocity adjusting layer 170 may also be disposed in the recess of the intermediate layer, disposed on a side of the passivation layer away from the intermediate layer, or buried in the intermediate layer.

FIG. 5A and FIG. 6A to FIG. 6H illustrate various examples in which the acoustic velocity adjusting layer 170 is disposed in the central region of the interdigital electrode region. The relative positional relationship and structural characteristics between the acoustic velocity adjusting layer 170, the intermediate layer 160 and the passivation layer 180 illustrated in these figures are similar to or substantially the same as those described in the previous embodiments with reference to FIGS. 2A and 3A to 3H, and will not be repeated here.

In this embodiment, the acoustic velocity adjusting layer 170 is disposed in the central region of the interdigital electrode region, so that the acoustic velocity in the interdigital electrode central region can be accelerated. In some embodiments, the thickness of the portion of the intermediate layer located in the central region is reduced, so that the acoustic velocity in the interdigital electrode central region can be further accelerated. Moreover, through providing the first protruding structure including a plurality of mass loading blocks in the end regions, the acoustic velocity in the first end region and the second end region can be reduced, thereby further increasing the acoustic velocity difference between the central region and the end regions, which is more conducive to suppressing clutter.

In some embodiments, the protruding structure is disposed in the interdigital electrode end regions, but not in the region where the reflective gratings is located. In an alternative embodiment, a protruding structure may also be provided in the region where the reflective grating is located.

For example, the surface acoustic wave resonator device further includes a second protruding structure, which is disposed in an extension region of the first end region and the second end region of the interdigital electrode region being extended in the second direction, and the second protruding structure includes part of the first reflective grating and/or the second reflective grating, or the orthographic projection of the second protruding structure on the piezoelectric substrate overlaps with the orthographic projection(s) of the first reflective grating and/or the second reflective grating on the piezoelectric substrate.

In some embodiments, the second protruding structure includes a plurality of second mass loading blocks, which are disposed on a side of the plurality of reflective electrodes of the first reflective grating and the second reflective grating away from the piezoelectric substrate, and are located in the extension region, in the second direction, of the first end region and the second end region.

Figure 7A:
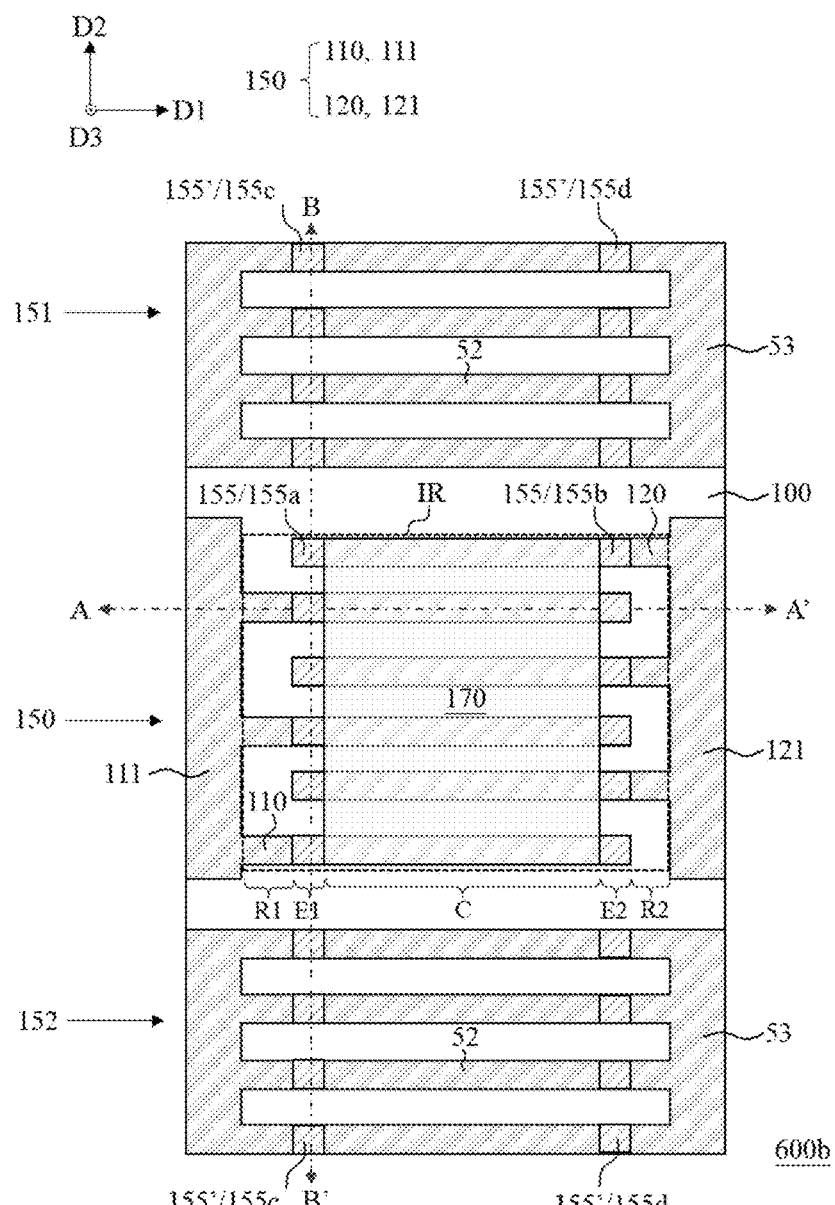
FIG. 7A illustrates a schematic plan view of a surface acoustic wave resonator device according to some other alternative embodiments of the present disclosure.
Figure 7B:
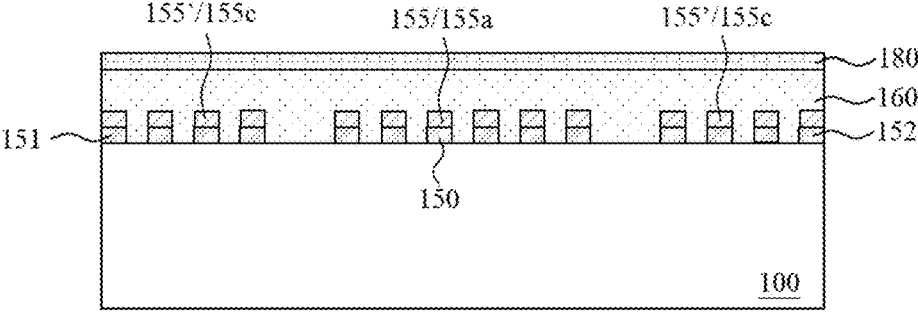
FIG. 7B illustrates a schematic cross-sectional view of a surface acoustic wave resonator device according to some other alternative embodiments of the present disclosure, taken along line B-B' of FIG. 7A.

FIG. 7A illustrates a schematic plan view of a surface acoustic wave resonator device 600b according to some alternative embodiments of the present disclosure; FIG. 7B illustrates a schematic cross-sectional view of a surface acoustic wave resonator device 600b taken along line B-B' of FIG. 7A according to some alternative embodiments of the present disclosure. The surface acoustic wave resonator device 600b is similar to the surface acoustic wave resonator device 600a of the above embodiment, and the difference lies in that the surface acoustic wave resonator device 600b further includes a second protruding structure 155' disposed on the reflective grating.

Referring to FIG. 7A and FIG. 7B, in some embodiments, the second protruding structure 155' includes a plurality of mass loading blocks 155c and 155d overlapping with the reflective electrodes of the reflective grating. The mass loading blocks 155c and 155d may be or include metal blocks. The plurality of mass loading blocks 155c and 155d may be collectively referred to as a second mass loading block.

For example, the plurality of mass loading blocks 155c are disposed in a region corresponding to the first end region E1 of the interdigital electrode region (i.e., a region where the first end region E1 extends in the second direction D2), and are disposed on a side of the plurality of reflective electrodes 52 of the first and second reflective gratings 151 and 152 away from the piezoelectric substrate 100, and covers and contacts the surfaces of the plurality of reflective electrodes 52 at a side away from the piezoelectric substrate. The plurality of mass loading blocks 155c and the plurality of mass loading blocks 155a are arranged at intervals along the second direction D2, and may be substantially aligned with each other in the second direction D2. For example, the plurality of mass loading blocks 155c may be disposed in one-to-one correspondence with the plurality of reflective electrodes 52 of the first reflective grating 151 and the second reflective grating 152. Each mass loading block 155c is disposed on a corresponding one of the reflective electrodes 52, that is, each mass loading block 155c overlaps with the corresponding reflective electrode 52 in the direction perpendicular to the main surface of the piezoelectric substrate. For example, for the mass loading block 155c and the reflective electrode 52 overlapping with each other, the mass loading block 155c may have a sidewall substantially aligned with a sidewall of the reflective electrode 52 in the direction perpendicular to the main surface of the piezoelectric substrate; the width of the mass loading block 155c in the second direction D2 may be substantially equal to the width of the reflective electrode 52 in the second direction D2.

For example, the plurality of mass loading blocks 155d are disposed in a region corresponding to the second end region E2 of the interdigital electrode region (i.e., a region where the second end region E2 extends in the second direction D2), and are disposed on the side of the plurality of reflective electrodes 52 of the first and second reflective gratings 151 and 152 away from the piezoelectric substrate 100, and covers and contacts the surfaces of the plurality of reflective electrodes 52 at a side away from the piezoelectric substrate. The plurality of mass loading blocks 155d and the plurality of mass loading blocks 155b are arranged at intervals along the second direction D2, and may be substantially aligned with each other in the second direction D2. For example, the plurality of mass loading blocks 155d may be disposed in one-to-one correspondence with the plurality of reflective electrodes 52 of the first reflective grating 151 and the second reflective grating 152. Each mass loading block 155d is disposed on a corresponding one of the reflective electrodes 52, that is, each mass loading block 155d overlaps with the corresponding reflective electrode 52 in the direction perpendicular to the main surface of the piezoelectric substrate. For example, for the mass loading block 155d and the reflective electrode 52 overlapping with each other, the mass loading block 155d may have a sidewall substantially aligned with the reflective electrode 52 in the direction perpendicular to the main surface of the piezoelectric substrate; the width of the mass loading block 155d in the second direction D2 may be substantially equal to the width of the reflective electrode 52 in the second direction D2.

In some embodiments, the first protruding structure 155 and the second protruding structure 155' are disposed in the same layer and may be formed from the same material layer by a patterning process. The plurality of mass loading blocks of the first protruding structure 155 and the second protruding structure 155' may include a metal material, and the metal material may be the same as or different from that of the interdigital transducer and the reflective grating. For example, the mass loading block may include a metallic material such as tungsten (W), platinum (Pt), gold (Au), copper (Cu), zinc (Zn), silver (Ag), molybdenum (Mo) or any combination thereof.

The surfaces of the first protruding structure and the second protruding structure at a side close to the piezoelectric substrate are in contact with the interdigital electrode end parts and the reflective electrodes, respectively, and the sidewalls of the first protruding structure and the second protruding structure and their surfaces at a side away from the piezoelectric substrate are covered by and in contact with the intermediate layer 160.

The cross-sectional view of the surface acoustic wave resonator device 600b taken along line A-A' in FIG. 7A is substantially the same as that of the surface acoustic wave resonator device 600a taken along line A-A' in FIG. 4A, and may have the structure illustrated in any one of FIGS. 5A and 6A to 6H. For details, reference can be made to the contents described above with reference to FIGS. 5A and 6A to 6H, which are not repeated here.

In some other embodiments, the first protruding structure is disposed in the same layer as the interdigital transducer and includes end parts of a plurality of interdigital electrodes located in the first end region and the second end region; the end parts (i.e., the first end part and the second end part) of the plurality of interdigital electrodes each have a second width in the second direction, and the portions (i.e., the central parts) of the plurality of interdigital electrodes located in the central region each have a first width in the second direction, and the second width is greater than the first width. That is, the end parts of the plurality of interdigital electrodes protrude from the central parts of the plurality of interdigital electrodes in the second direction, respectively.

Figure 8A:
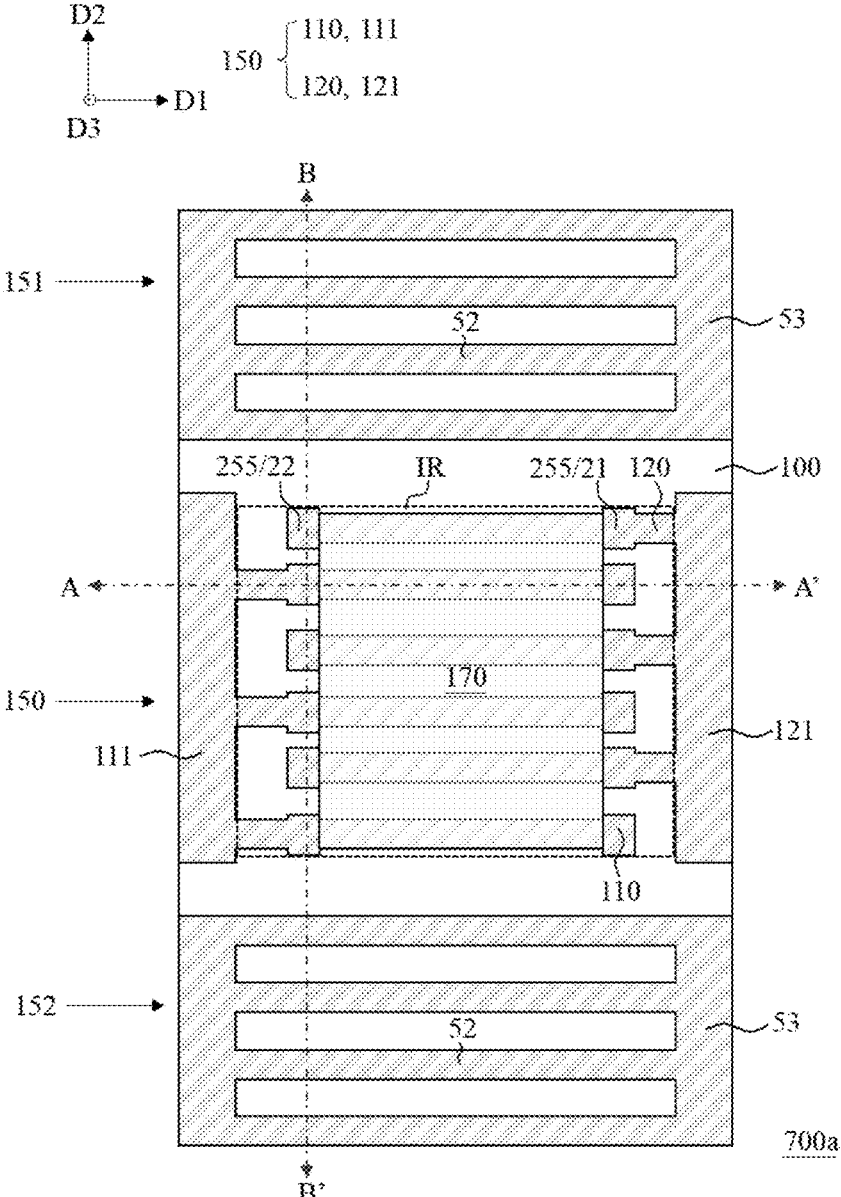
FIG. 8A illustrates a schematic plan view of a surface acoustic wave resonator device according to some other embodiments of the present disclosure.
Figure 8B:
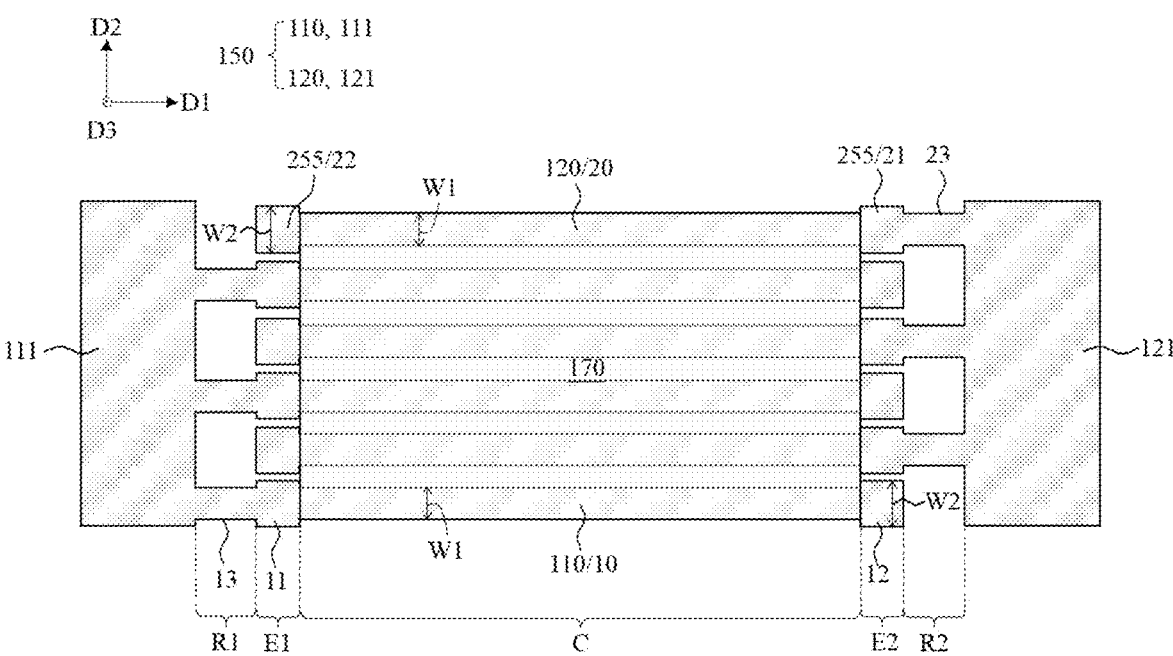
FIG. 8B illustrates a schematic enlarged plan view of an interdigital transducer in the surface acoustic wave resonator device illustrated in FIG. 8A according to some other embodiments of the present disclosure.
Figure 9A:
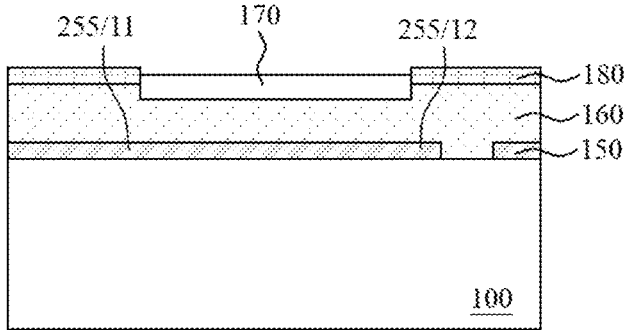
FIG. 9A and FIG. 9B illustrate schematic cross-sectional views of a surface acoustic wave resonator device according to some other embodiments of the present disclosure, and are cross-sectional views taken along line A-A' and line B-B' of FIG. 8A, respectively.
Figure 9B:
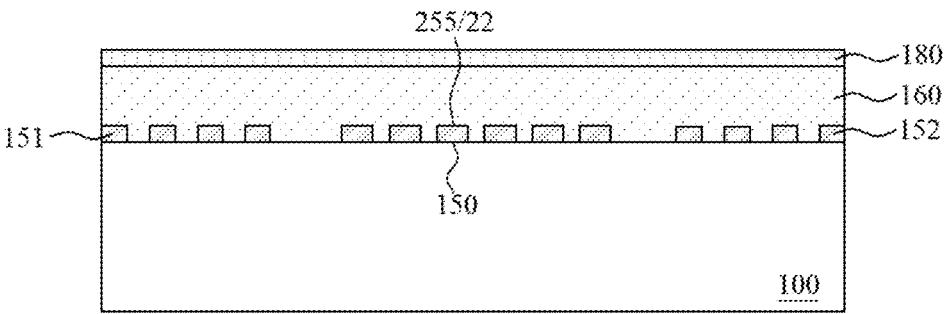
Figure 10A:
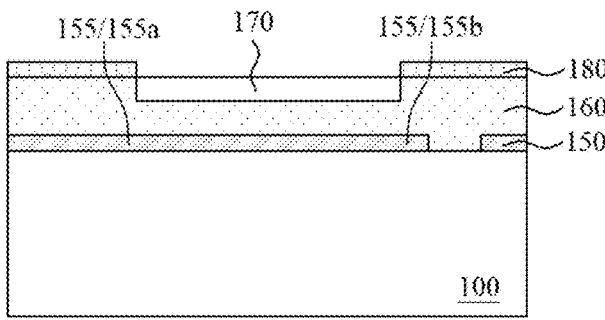
FIG. 10A to FIG. 10H illustrate schematic cross-sectional views of a surface acoustic wave resonator device taken along line A-A' of FIG. 8A according to some alternative embodiments of the present disclosure.
Figure 10B:
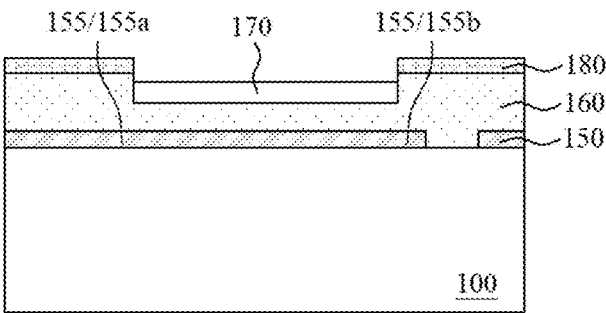
Figure 10C:
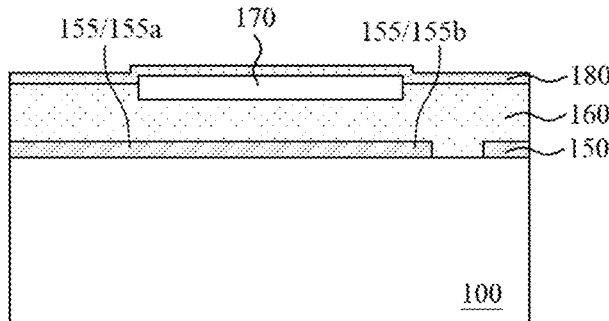
Figure 10D:
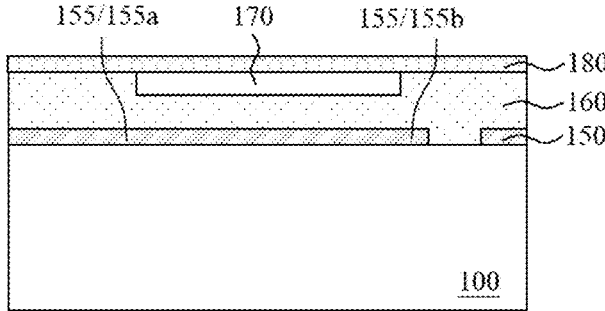
Figure 10E:
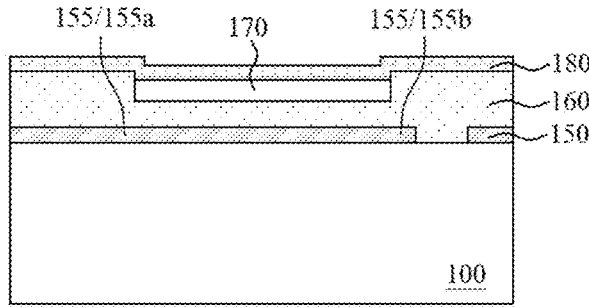
Figure 10F:
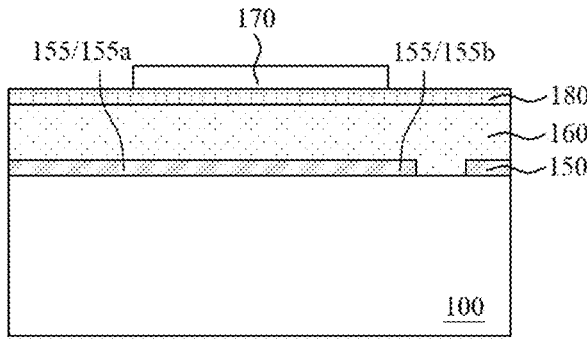
Figure 10G:
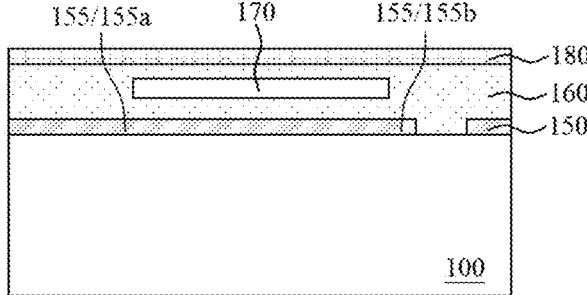
Figure 10H:
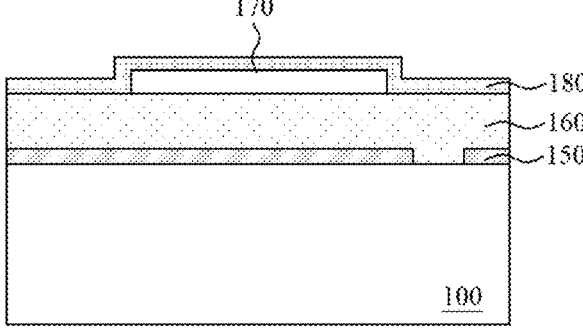

FIG. 8A illustrates a schematic plan view of a surface acoustic wave resonator device 700a according to some other embodiments of the present disclosure; FIG. 8B illustrates a schematic enlarged plan view of an interdigital transducer in the surface acoustic wave resonator device illustrated in FIG. 8A according to some other embodiments of the present disclosure. FIG. 9A and FIG. 9B illustrate schematic cross-sectional views of a surface acoustic wave resonator device according to some other embodiments of the present disclosure, and are cross-sectional views taken along line A-A' and line B-B' of FIG. 8A, respectively. FIG. 10A to FIG. 10H illustrate cross-sectional views of a surface acoustic wave resonator device taken along line A-A' of FIG. 8A according to some alternative embodiments. The surface acoustic wave resonator device 700a is similar to the surface acoustic wave resonator device of the previous embodiment, and the difference lies in that the surface acoustic wave resonator device 700a further includes a first protruding structure disposed on the end region of the interdigital electrode region, and the first protruding structure is disposed in the same layer as the interdigital transducer.

Referring to FIGS. 8A, 8B, 9A and 9B, in some embodiments, the central part 10 of the first interdigital electrode 110 and the central part 20 of the second interdigital electrode 120 each have a first width W1 in the second direction D2. The first end part 11 and the second end part 12 of the first interdigital electrode 110 as well as the first end part 21 and the second end part 22 of the second interdigital electrode 120 each have a second width W2 in the second direction D2, and the second width W2 is greater than the first width W1. For example, the first widths W1 of the central parts of the respective interdigital electrodes may be substantially the same as each other, and the second widths W2 of the end parts of the respective interdigital electrodes may be substantially the same as each other.

The end parts of the plurality of interdigital electrodes having a larger width (i.e., the first end part and the second end part of the first interdigital electrode, and the first end part and the second end part of the second interdigital electrode) together constitute a first protruding structure 255 located in the interdigital electrode end region. That is, the first protruding structure 255 includes end parts of the plurality of interdigital electrodes. In this embodiment, the first protruding structure 255 protrudes from the edge of the interdigital electrode central part in a direction parallel to the main surface of the piezoelectric substrate (e.g., the second direction D2). In some embodiments, the first protruding structure constituted by the interdigital electrode end parts with a larger width may be referred to as a hammer head structure; providing such a hammer head structure can also help to reduce the acoustic velocity in the interdigital electrode end region, thus achieving the effect of suppressing clutter.

The surface acoustic wave resonator device 700a also includes an acoustic velocity adjusting layer 170 disposed in the interdigital electrode central region. For example, the orthographic projection of the acoustic velocity adjusting layer 170 on the piezoelectric substrate and the orthographic projection of the first protruding structure 255 (i.e., the end parts of a plurality of interdigitated electrodes) on the piezoelectric substrate may be offset from each other, for example, may border but not overlap each other.

In this embodiment, the acoustic velocity adjusting layer 170 may also be disposed in the recess of the intermediate layer, at the side of the passivation layer away from the intermediate layer or buried in the intermediate layer.

FIG. 9A and FIGS. 10A to 10H illustrate various examples in which the acoustic velocity adjusting layer 170 is disposed in the central region of the interdigital electrode region. The relative positional relationship and structural characteristics between the acoustic velocity adjusting layer 170, the intermediate layer 160 and the passivation layer 180 illustrated in these figures are similar to or substantially the same as those described in the previous embodiment with reference to FIG. 2A and FIGS. 3A to 3H, and will not be repeated here.

In this embodiment, the acoustic velocity adjusting layer is disposed in the central region of the interdigital electrode region to accelerate the acoustic velocity in the interdigital electrode central region, so that there is an acoustic velocity difference between the interdigital electrode central region and the interdigital electrode end region. In some embodiments, by reducing the thickness of the portion of the intermediate layer located in the central region, the acoustic velocity in the interdigital electrode central region can be further accelerated. Moreover, by disposing the first protruding structure constituted by interdigital electrode end parts with a larger width in the end region, the acoustic velocity in the first end region and the second end region can be reduced, thereby further increasing the acoustic velocity difference between the central region and the end region, which is more conducive to suppressing clutter.

Referring to FIG. 8A, in some embodiments, the hammer head structure, serving as the first protruding structure, is disposed in the end regions of the interdigital electrode region, but is not disposed in the region where the reflective gratings are located. For example, the widths, in the second direction D2, of the respective parts of each reflective electrode 52 of the first reflective grating 151 and the second reflective grating 152 are substantially the same. For example, the width of the portion of the reflective electrode 52 located in the extension region of the interdigital electrode central region in the second direction may be substantially equal to the width of the portion of the reflective electrode 52 located in the extension region of the interdigital electrode end region in the second direction.

In some other embodiments, the reflective electrodes of the first reflective grating and/or the second reflective grating may also be provided with a second protruding structure similar to the interdigital electrode hammer structure. For example, among a plurality of reflective electrodes of the first reflective grating and/or the second reflective grating, each reflective electrode includes a first electrode portion, a second electrode portion and a third electrode portion, which are respectively located in the extension regions of the central region, the first end region and the second end region of the interdigital electrode region in the second direction. The widths of the second electrode portion and the third electrode portion in the second direction are greater than the width of the first electrode portion in the second direction, and the second protruding structure includes second electrode portions and third electrode portions of the plurality of reflective electrodes.

Figure 11A:
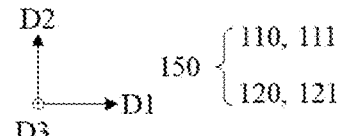
FIG. 11A illustrates a schematic plan view of a surface acoustic wave resonator device according to some other alternative embodiments of the present disclosure.
Figure 11A:
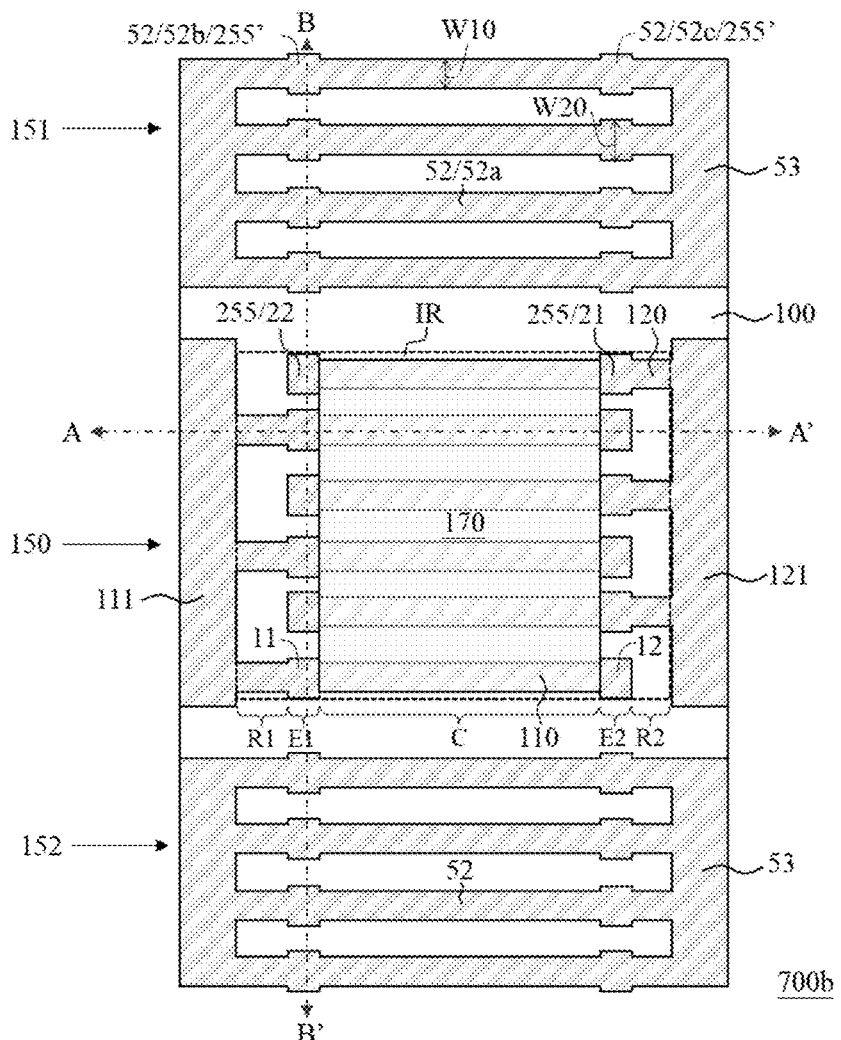
Figure 11B:
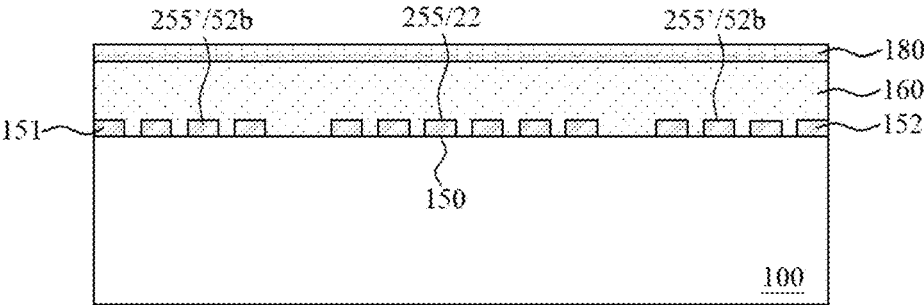
FIG. 11B illustrates a schematic cross-sectional view of a surface acoustic wave resonator device according to some other alternative embodiments of the present disclosure taken along line B-B' of FIG. 11A.

FIG. 11A illustrates a schematic top view of a surface acoustic wave resonator device 700b according to some alternative embodiments of the present disclosure; FIG. 11B illustrates a schematic cross-sectional view of a surface acoustic wave resonator device 700b taken along line B-B' of FIG. 11A according to some alternative embodiments of the present disclosure. The surface acoustic wave resonator device 700b is similar to the surface acoustic wave resonator device 700a, and the difference lies in that the surface acoustic wave resonator device 700b further includes a second protruding structure located in the reflective grating.

Referring to FIG. 11A and FIG. 11B, in some embodiments, in the first reflective grating 151 and the second reflective grating 152, each reflective electrode 52 may include a first electrode portion 52a, a second electrode portion 52b and a third electrode portion 52c. The first electrode portion 52a is located in a region corresponding to the interdigital electrode central region, and the second electrode portion 52b and the third electrode portion 52c are located in regions corresponding to the interdigital electrode end regions. The first electrode portion 52a has a first reflective electrode width W10 in the second direction D2, and the second electrode portion 52b and the third electrode portion 53c each have a second reflective electrode width W20 in the second direction D2, and the second reflective electrode width W20 is greater than the first reflective electrode width W10. The widths of the second electrode portion 52b and the third electrode portion 53c may be substantially the same.

For example, the plurality of first electrode portions 52a of the first and second reflective gratings are located in the extension region of the interdigital electrode central region in the second direction, and are substantially aligned with the central parts of the plurality of interdigital electrodes in the second direction. The plurality of second electrode portions 52b of the first and second reflective gratings are located in the extension region of the first end region E1 of the interdigital electrode region in the second direction D2, and are arranged at intervals with respect to and substantially aligned with the first end part 11 of the first interdigital electrode 110 and the second end part 22 of the second interdigital electrode 120 in the second direction D2. The plurality of third electrode portions 52c of the first and second reflective gratings are located in the extension region of the second end region E2 of the interdigital electrode region in the second direction D2, and are arranged at intervals with respect to and substantially aligned with the second end part 12 of the first interdigital electrode 110 and the first end part 21 of the second interdigital electrode 120 in the second direction D2.

In this embodiment, the second electrode portions 52b and the third electrode portions 52c of a plurality of reflective electrodes of the reflective gratings together constitute a second protruding structure 255', and the second protruding structure 255' protrudes from the first electrode portion 52a of the reflective electrode and the like in a direction parallel to the main surface of the piezoelectric substrate (e.g., the second direction D2). The second protruding structure 255' may also be referred to as a hammer head structure. It is also beneficial to suppress traverse clutter by providing a hammer structure in the region where the reflective gratings are located.

In some embodiments, the acoustic velocity adjusting layer 170 is disposed in the central region of the interdigital electrode region, and does not extend into the region where the first or second reflective grating is located. That is, the orthographic projections of the first reflective grating 151 and the second reflective grating 152 on the piezoelectric substrate may be offset from the orthographic projection of the acoustic velocity adjusting layer 170 on the piezoelectric substrate, and the orthographic projection of the second protruding structure 255' on the piezoelectric substrate 100 may not border the orthographic projection of the acoustic velocity adjusting layer 170 on the piezoelectric substrate, but the present disclosure is not limited thereto. In an alternative embodiment, the acoustic velocity adjusting layer 170 may also extend into the region where the first reflective grating and/or the second reflective grating are located, and overlap with one or more reflective electrodes in the direction perpendicular to the main surface of the piezoelectric substrate. The orthographic projection of the acoustic velocity adjusting layer 170 on the piezoelectric substrate may also border the orthographic projection of the second protruding structure 255' on the piezoelectric substrate 100.

In this embodiment, the cross-sectional structure of the surface acoustic wave resonator device 700b taken along line A-A' in FIG. 11A may be similar to or substantially the same as the cross-sectional structure of the surface acoustic wave resonator device 700a taken along line A-A' in FIG. 8A, and may have the structure illustrated in any one of FIGS. 9A and 10A to 10H. For details, reference can be made to the contents described above about these drawings, which will not be repeated here.

Figure 12B:
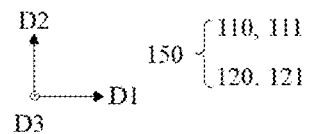
FIG. 12B illustrates a schematic enlarged plan view of an interdigital transducer in the surface acoustic wave resonator device illustrated in FIG. 8A according to some further embodiments of the present disclosure.
Figure 12B:
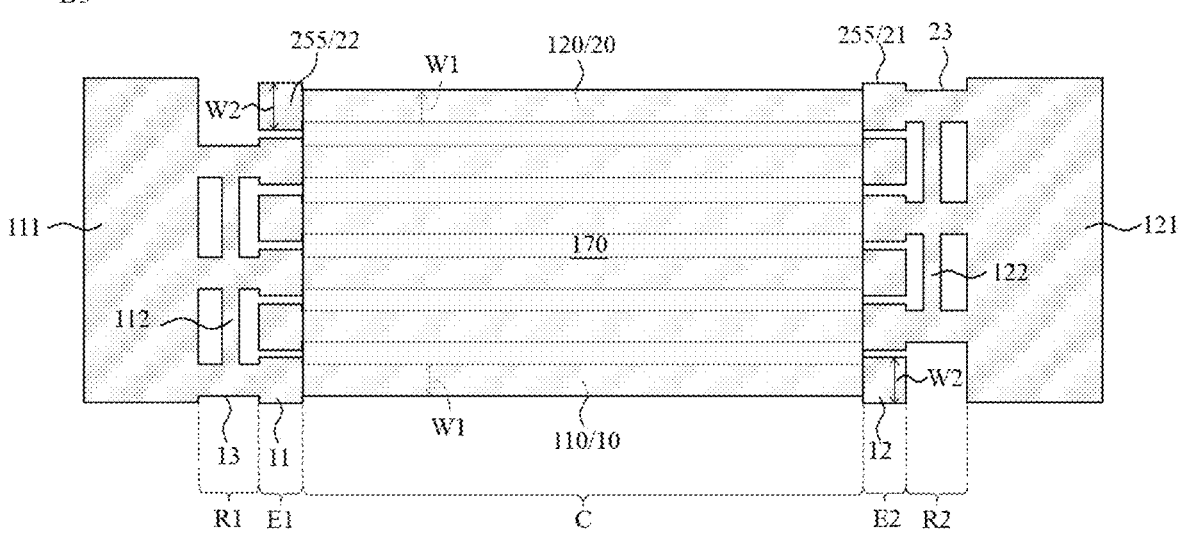

FIG. 12A illustrates a schematic plan view of a surface acoustic wave resonator device 800a according to some other embodiments of the present disclosure; FIG. 12B illustrates a schematic enlarged plan view of an interdigital transducer in the surface acoustic wave resonator device illustrated in FIG. 12A according to some other embodiments of the present disclosure. FIG. 13A and FIG. 13B illustrate schematic cross-sectional views of a surface acoustic wave resonator device according to some other embodiments of the present disclosure, and are cross-sectional views taken along line A-A' and line B-B' of FIG. 12A, respectively. FIGS. 14A to 14H illustrate cross-sectional views of a surface acoustic wave resonator device taken along line A-A' of FIG. 12A according to some alternative embodiments of the present disclosure. The surface acoustic wave resonator device 800a is similar to the surface acoustic wave resonator device of the previous embodiment, and the difference lies in that the surface acoustic wave resonator device 800a further includes additional bus bars disposed in the interdigital electrode periphery regions.

In some embodiments, the surface acoustic wave resonator device further includes a first additional bus bar and a second additional bus bar, wherein the first additional bus bar is located in the first peripheral region, extends along the second direction, and is connected with the first interdigital electrode; the second additional bus bar is located in the second peripheral region, extends along the second direction, and is connected with the second interdigital electrode. In this embodiment, the first bus bar, the first additional bus bar and the plurality of first interdigital electrodes are connected with each other to together constitute a first interdigital electrode structure. For example, the first bus bar, the first additional bus bar and the plurality of first interdigital electrodes may be disposed in the same layer, and may be integrally formed, for example. The second bus bar, the second additional bus bar and the plurality of second interdigital electrodes are connected with each other to together constitute a second interdigital electrode structure. For example, the second bus bar, the second additional bus bar and the plurality of second interdigital electrodes may be disposed in the same layer, and may be integrally formed, for example.

Referring to FIG. 12A and FIG. 12B, in some embodiments, the interdigital transducer 150 of the surface acoustic wave resonator device 800a may further include a first additional bus bar 112 and a second additional bus bar 122. The first additional bus bar 112 is located in the first peripheral region R1, extends along the second direction D2, and is connected with a plurality of first interdigital electrodes 110. For example, the first additional bus bar 112 is located between the first bus bar 111 and the end parts of the plurality of interdigital electrodes in the first direction D1, and is connected to the connecting parts 13 of the plurality of first interdigital electrodes 110. The second additional bus bar 122 is located in the second peripheral region R2, extends along the second direction D2, and is connected with a plurality of second interdigital electrodes 120. For example, the second additional bus bar 122 is located between the second bus bar 121 and the end parts of the plurality of interdigital electrodes in the first direction D1, and is connected to the connecting parts 23 of the plurality of second interdigital electrodes 120. The first additional bus bar 112 is electrically isolated from the second interdigital electrode structure, and the second additional bus bar 122 is electrically isolated from the first interdigital electrode structure.

In some embodiments, the width of the first additional bus bar 112 in the first direction D1 may be smaller than the width of the first bus bar 111 in the first direction D1; the width of the second additional bus bar 112 in the first direction D1 may be smaller than the width of the second bus bar 121 in the first direction D1. The first additional bus bar 112 and the first bus bar 111 may be arranged side by side and spaced apart from each other in the first direction D1; the second additional bus bar 122 and the second bus bar 121 may be arranged side by side and spaced apart from each other in the first direction D1.

In this embodiment, by disposing additional bus bars in the peripheral regions, the acoustic velocity in the regions where the additional bus bars are disposed can be changed (e.g., reduced), thereby resulting in an acoustic velocity difference between different regions, and achieving the effect of clutter suppression.

Similar to the previous embodiments, an acoustic velocity adjusting layer 170 may be disposed in the central region of the interdigital electrode region. In addition, a first protruding structure may be disposed at the end region of the interdigital electrode region. For example, as illustrated in FIGS. 12A and 12B, the end parts of a plurality of interdigital electrodes may be set to have a larger width, thereby forming a hammer head structure as the first protruding structure; alternatively, the first protruding structure may be disposed to include a plurality of mass loading blocks located on the end part of the interdigital electrodes (as illustrated in FIGS. 4A and 4B); alternatively, the first protruding structure located at the interdigital electrode end region may be omitted. For example, an additional bus bar may be further provided in the interdigital electrode peripheral region of any one of the surface acoustic wave resonator devices 500, 600*a*, 600*b*, 700*a*, 700*b* in the previous embodiments, so as to further improve the clutter suppression capability of the resonator device.

In this embodiment, the cross-sectional structure of the surface acoustic wave resonator device 800*a* illustrated in FIG. 13A taken along line A-A' in FIG. 12A may be similar to the cross-sectional view of the surface acoustic wave resonator device 700*a* illustrated in FIG. 9A taken along line A-A' in FIG. 8A, except that the cross-sectional view illustrated in FIG. 13A further includes a second additional bus bar 122 disposed between the end part of the first interdigital electrode and the second bus bar. The cross-sectional structure of the surface acoustic wave resonator device 800*a* illustrated in FIG. 13B taken along line B-B' in FIG. 12A may be substantially the same as the cross-sectional view of the surface acoustic wave resonator device 700*a* illustrated in FIG. 9B taken along line B-B' in FIG. 8A, and will not be repeated here.

In this embodiment, the acoustic velocity adjusting layer 170 may also be disposed in the recess of the intermediate layer, at the side of the passivation layer away from the intermediate layer or buried in the intermediate layer.

FIG. 13A and FIGS. 14A to 14H illustrate various examples in which the acoustic velocity adjusting layer 170 is disposed in the central region of the interdigital electrode region. The relative positional relationship and structural characteristics between the acoustic velocity adjusting layer 170, the intermediate layer 160 and the passivation layer 180 illustrated in these figures are similar to or substantially the same as those described in the previous embodiments with reference to FIG. 2A and FIGS. 3A to 3H, and are not repeated here.

In this embodiment, the acoustic velocity adjusting layer is disposed in the central region of the interdigital electrode region to accelerate the acoustic velocity in the interdigital electrode central region, so that there is an acoustic velocity difference between the interdigital electrode central region and the interdigital electrode end region. In some embodiments, by reducing the thickness of the portion of the intermediate layer located in the central region, the acoustic velocity in the interdigital electrode central region can be further accelerated. Moreover, providing the first protruding structure constituted by the interdigital electrode end parts with a larger width in the end region can reduce the acoustic velocity in the first end region and the second end region, thereby further increasing the acoustic velocity difference between the central region and the end region, which is more conducive to suppressing clutter. In addition, by disposing additional bus bars in the first peripheral region and the second peripheral region, the acoustic velocity in these regions can also be changed, thereby introducing more regions with changed acoustic velocity, so that there is an acoustic velocity difference between these regions and other regions of the interdigital electrode region, which can be more conducive to suppressing clutter.

FIG. 15A illustrates a schematic top view of a surface acoustic wave resonator device 800*b* according to some alternative embodiments of the present disclosure; FIG. 15B illustrates a schematic cross-sectional view of a surface acoustic wave resonator device 800*b* taken along line B-B' of FIG. 15A according to some alternative embodiments of the present disclosure. The surface acoustic wave resonator device 800*b* is similar to the surface acoustic wave resonator device 800*a*, and the difference lies in that the surface acoustic wave resonator device 800*b* further includes a second protruding structure 255' disposed in the region where the reflective grating is located. The related structural features of the second protruding structure 255' in the surface acoustic wave resonator device 800*b* are substantially the same as those of the second protruding structure 255' in the surface acoustic wave resonator device 700*b* illustrated in FIG. 11A, and the cross-sectional structure illustrated in FIG. 15B is substantially the same as that illustrated in FIG. 11B, which are not repeated here.

In this embodiment, the cross-sectional structure of the surface acoustic wave resonator device 800*b* illustrated in FIG. 15B, taken along line A-A' in FIG. 15A, may be similar to or substantially the same as the cross-sectional view of the surface acoustic wave resonator device 800*a* illustrated in FIG. 13B, and may have the structure illustrated in any one of FIGS. 13A and 14A to 14H. For details, reference can be made to the contents described above about these drawings, which are not repeated here.

FIG. 16 illustrates a schematic plan view of a surface acoustic wave resonator device 900 according to some other embodiments of the present disclosure. The surface acoustic wave resonator device 900 is similar to the surface acoustic wave resonator device 500 of the previous embodiment, and the difference lies in that, in the surface acoustic wave resonator device 900, the acoustic velocity adjusting layer 170 further extends into the region where the reflective grating is located.

In some embodiments, the orthographic projection of the acoustic velocity adjusting layer on the piezoelectric substrate may overlap with the orthographic projections of the first reflective grating and/or the second reflective grating (e.g., one or more reflective electrodes) on the piezoelectric substrate.

Referring to FIG. 16, for example, the acoustic velocity adjusting layer 170 extends beyond the interdigital electrode region IR in the second direction D2, and may extend into the region where the first reflective grating 151 and the second reflective grating 152 are located, and overlaps with the plurality of reflective electrodes 52 in the direction perpendicular to the main surface of the piezoelectric substrate. For example, the orthographic projections of the plurality of reflective electrodes 52 on the piezoelectric substrate may also be located within the orthographic projection of the acoustic velocity adjusting layer 170 on the piezoelectric substrate. For example, the extending portion of the acoustic velocity adjusting layer 170 may be located in the extension region of the interdigital electrode central region in the second direction D2, and may overlap with the first electrode portion(s) of one or more reflective electrodes in the direction perpendicular to the main surface of the piezoelectric substrate. The first electrode portions of the one or more reflective electrodes overlap with and are substantially aligned with the central parts of the plurality of interdigital electrodes in the second direction D2.

The embodiment illustrated in FIG. 16 is a variation of a surface acoustic wave resonator device 500, which schematically illustrates an example in which the acoustic velocity adjusting layer 170 extends to the region where the reflective grating is located. It should be understood that in the surface acoustic wave resonator devices 600*a*, 600*b*, 700*a*, 700*b*, 800*a*, 800*b* of some other embodiments, the acoustic velocity adjusting layer 170 may also further extend into the region where the first reflective grating and/or the second reflective grating are located.

An embodiment of the present disclosure provides a manufacturing method of a surface acoustic wave resonator device, wherein the surface acoustic wave resonator device has an interdigital electrode region including a first peripheral region, a first end region, a central region, a second end region and a second peripheral region which are sequentially arranged in a first direction; and the manufacturing method includes: providing a piezoelectric substrate; forming an interdigital transducer on the piezoelectric substrate, wherein the interdigital transducer includes a plurality of interdigital electrodes which are located in the interdigital electrode region and include a first interdigital electrode and a second interdigital electrode, the first interdigital electrode and the second interdigital electrode extend along the first direction and are alternately arranged along a second direction intersecting the first direction, the first interdigital electrode extends from the first peripheral region to the second end region, and the second interdigital electrode extends from the second peripheral region to the first end region; forming an intermediate layer on the piezoelectric substrate to cover the interdigital transducer; forming an acoustic velocity adjusting layer on at least part of the intermediate layer at a side away from the piezoelectric substrate; and forming a passivation layer on a side of the intermediate layer away from the piezoelectric substrate, wherein the acoustic velocity adjusting layer is located in the central region, overlaps with the portions of the plurality of interdigital electrodes located in the central region in the direction perpendicular to the main surface of the piezoelectric substrate, and is configured to change the acoustic velocity in the central region.

For example, a piezoelectric substrate 100 is provided, and the piezoelectric substrate 100 may include a suitable piezoelectric material such as piezoelectric crystal, piezoelectric ceramic or the like. For example, the material of the piezoelectric substrate 100 may be aluminum nitride (AlN), doped aluminum nitride, zinc oxide (ZnO), lead zirconate titanate (PZT), lithium niobate (LiNbO$_3$), quartz, potassium niobate (KNbO$_3$), lithium tantalate (LiTaO$_3$), the like, or combinations thereof. In some embodiments, the piezoelectric substrate 100 may be a single-layer structure or a multi-layer structure, for example, may be a piezoelectric thin film composite structure, such as a composite structure of lithium tantalate piezoelectric thin film/silicon dioxide/silicon substrate. However, the present disclosure is not limited thereto.

In some embodiments, forming the interdigital transducer 150 on the piezoelectric substrate 100 may include: forming a metal material layer on the piezoelectric substrate, and then performing a patterning process on the metal material layer to form a first metal layer including the interdigital transducer. In some embodiments, the first reflective grating 151 and the second reflective grating 152 and the interdigital transducer 150 are disposed in the same layer, and may be formed by the same patterning process. For example, performing the patterning process on the metal material layer further forms the first reflective grating and the second reflective grating. That is, the interdigital transducer, the first reflective grating and the second reflective grating are all disposed at the first metal layer. In the cast that the interdigital transducer 150 includes a hammer head structure as a first protruding structure, and/or, the first reflective grating 151 and the second reflective grating 152 include a hammer head structure as a second protruding structure, the hammer head structure is also formed by the patterning process.

In some embodiments, in the case that the interdigital transducer 150 includes mass loading blocks as a first protruding structure, and/or, the first reflective grating 151 and the second reflective grating 152 include mass loading blocks as a second protruding structure, these mass loading blocks may be formed by the following processes: after forming the first metal layer, forming a mass loading material layer on the piezoelectric substrate and the first metal layer, wherein the mass loading material layer may be or include a metal material layer, for example; then performing a patterning process on the mass loading material layer to form the mass loading blocks (e.g., metal blocks).

Thereafter, an intermediate layer 106 is formed on the piezoelectric substrate 100 to cover the first metal layer including the interdigital transducer and the reflective grating, and also cover the mass loading blocks in the embodiment with the mass loading blocks. For example, the intermediate layer may be formed by a deposition process; the intermediate layer may be further subjected to a planarization process (e.g., a chemical mechanical polishing process), so that the intermediate layer has a substantially flat surface. The intermediate layer 106 includes at least a temperature compensation layer (e.g., a silicon oxide layer), or may further include a protection layer (e.g., a non-silicon-oxide layer) located on a side of the temperature compensation layer close to the piezoelectric substrate.

In some embodiments, forming the acoustic velocity adjusting layer on the side of at least part of the intermediate layer away from the piezoelectric substrate includes: performing an etching process on the intermediate layer to remove the part of the intermediate layer located in the central region to form a recess in the intermediate layer; and forming the acoustic velocity adjusting layer in the recess of the intermediate layer.

For example, as illustrated in FIGS. 2A and 3A to 3E, an etching process may be performed on the intermediate layer 160 to remove a portion of the intermediate layer 160 and form a recess 161. It should be understood that, the recess 161 of the intermediate layer 160 corresponds to the position of the subsequently formed acoustic velocity adjusting layer. For example, the acoustic velocity adjusting layer is formed in the central region, the recess 161 is correspondingly formed in the central region; for example, in the example where the acoustic velocity adjusting layer extends to the region where the reflective grating is located, the recess 161 can also be correspondingly formed in the region where the reflective grating is located. It should be understood that, the recess 161 is formed in the temperature compensation layer of the intermediate layer, for example, formed at the top of the temperature compensation layer, and there is still enough temperature compensation material between the bottom of the recess and the interdigital transducer to achieve the temperature compensation function of the resonator. That is to say, a temperature compensation layer is disposed between the subsequently formed acoustic velocity adjusting layer and the interdigital transducer.

In some embodiments, an acoustic velocity adjusting layer 170 is formed in the recess 161 of the intermediate layer 160, wherein the thickness of the acoustic velocity adjusting layer 170 may be formed to be greater than, substantially equal to or smaller than the depth of the recess 161.

In some other embodiments, the step of forming the recess can also be omitted. For example, as illustrated in FIG. 3H, after the intermediate layer 160 is formed, the acoustic velocity adjusting layer 170 can be directly formed on the intermediate layer 160.

In some embodiments, forming the passivation layer includes: forming the passivation layer in the region outside the central region so that the passivation layer exposes the acoustic velocity adjusting layer; or the passivation layer is also formed in the central region to cover the surface of the acoustic velocity adjusting layer at a side away from the piezoelectric substrate.

For example, as illustrated in FIG. 2A, FIG. 3A and FIG. 3B, a passivation layer 180 is formed on the side of the intermediate layer 160 away from the piezoelectric substrate, and the passivation layer 180 is formed in a region other than the recess 161 (e.g., a region other than the central region), so that the passivation layer 180 exposes the acoustic velocity adjusting layer 170. That is, the surface of the acoustic velocity adjusting layer 170 at a side away from the piezoelectric substrate may not be covered by the passivation layer 180.

For example, as illustrated in FIGS. 3C to 3E, the passivation layer 180 may also be formed in the central region, and cover the surface of the acoustic velocity adjusting layer 170 at a side away from the piezoelectric substrate.

In some embodiments, after the passivation layer is formed on the side of the intermediate layer away from the piezoelectric substrate, the acoustic velocity adjusting layer is formed on the side of the passivation layer away from the piezoelectric substrate.

For example, as illustrated in FIG. 3F, after the intermediate layer 160 is formed, a passivation layer 180 is formed on the side of the intermediate layer 160 away from the piezoelectric substrate 100 firstly, and then an acoustic velocity adjusting layer 170 is formed on the side of the passivation layer 180 away from the piezoelectric substrate 100.

In some embodiments, the intermediate layer includes a first intermediate sub-layer and a second intermediate sub-layer, and forming the intermediate layer and the acoustic velocity adjusting layer includes: after forming the first intermediate sub-layer, forming the acoustic velocity adjusting layer on a side of the first intermediate sub-layer away from the piezoelectric substrate; and after forming the acoustic velocity adjusting layer, forming the second intermediate sub-layer on the side of the first intermediate sub-layer away from the piezoelectric substrate, so as to cover the first intermediate sub-layer and the acoustic velocity adjusting layer.

For example, as illustrated in FIG. 3G, forming the intermediate layer 160 may include: forming a first intermediate sub-layer and a second intermediate sub-layer, wherein the acoustic velocity adjusting layer 170 is formed on a side of the first intermediate sub-layer away from the piezoelectric substrate, and the second intermediate sub-layer is formed on the first intermediate sub-layer and the acoustic velocity adjusting layer 170, covering the sidewalls of the acoustic velocity adjusting layer 170 and the surface thereof at a side away from the piezoelectric substrate. There may be an interface between the first intermediate sub-layer and the second intermediate sub-layer, which is not specifically illustrated in the figure. The first intermediate sub-layer and the second intermediate sub-layer together constitute the intermediate layer 160, and the acoustic velocity adjusting layer 170 is buried in the intermediate layer 160.

An embodiment of the present disclosure provides a filter including the surface acoustic wave resonator described in any of the above embodiments.

In the surface acoustic wave resonator device, the manufacturing method thereof and the filter according to the embodiments of the present disclosure, the acoustic velocity adjusting layer is disposed in the interdigital electrode central region to change (e.g., accelerate) the acoustic velocity in the central region, so that there is an acoustic velocity difference between the interdigital electrode central region and the interdigital electrode end region, for example, the acoustic velocity in the central region is higher than that in the first end region and the second end region, thereby achieving the effect of suppressing clutter. In some embodiments, the acoustic velocity adjusting layer is disposed in the recess of the intermediate layer, and forming the recess in the intermediate layer can reduce the thickness of the intermediate layer, which can also help to accelerate the acoustic velocity in this region, and further increase the acoustic velocity difference between different regions (e.g., the central region and the end region) of the interdigital electrode, which is more conducive to suppressing clutter. In some embodiments, disposing a protruding structure (e.g., a hammer head structure or mass loading blocks) in the interdigital electrode end region and/or its extension region can reduce the acoustic velocity in this region, thereby further increasing the acoustic velocity difference between the central region and the end region, and further improving the ability of the resonator to suppress clutter. In some embodiments, an additional bus bar is provided in the interdigital electrode peripheral region, so that a region with changed (reduced) acoustic velocity is further introduced in the peripheral region, which can be more conducive to suppressing clutter. Therefore, through the above arrangement, the present disclosure can effectively suppress clutter, reduce energy loss, and further improve the quality factor and performance of the resonator device and the filter including the same.

The following statements should be noted: (1) The accompanying drawings related to the embodiments of the present disclosure involve only the structures in connection with the embodiments of the present disclosure, and other structures can be referred to common designs; (2) In case of no conflict, features in one embodiment or in different embodiments of the present disclosure can be combined.

The foregoing is only the preferred embodiments of the present disclosure and not intended to limit the scope of protection of the present disclosure. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A surface acoustic wave resonator device, having an interdigital electrode region comprising a first peripheral region, a first end region, a central region, a second end region and a second peripheral region sequentially arranged in a first direction, and the surface acoustic wave resonator device comprising:

a piezoelectric substrate;

an interdigital transducer, disposed on the piezoelectric substrate and comprising a plurality of interdigital electrodes which are located in the interdigital electrode region and comprise a first interdigital electrode and a second interdigital electrode; wherein the first interdigital electrode and the second interdigital electrode extend along the first direction and are alternately arranged along a second direction intersecting the first direction; the first interdigital electrode extends from the first peripheral region to the second end region, and the second interdigital electrode extends from the second peripheral region to the first end region;

an intermediate layer, disposed on the piezoelectric substrate and covering the interdigital transducer;

an acoustic velocity adjusting layer, disposed on a side of at least a portion of the intermediate layer which is away from the piezoelectric substrate;

a passivation layer, disposed on a side of the intermediate layer away from the piezoelectric substrate; and a first protruding structure, disposed in the first end region and the second end region, and configured to change an acoustic velocity in the first end region and an acoustic velocity in the second end region, wherein the acoustic velocity adjusting layer is located in the central region, overlaps with portions of the plurality of interdigital electrodes located in the central region in a direction perpendicular to a main surface of the piezoelectric substrate, and is configured to change an acoustic velocity in the central region, wherein the intermediate layer has a recess, and a portion of the acoustic velocity adjusting layer is located in the recess of the intermediate layer; and in the direction perpendicular to the main surface of the piezoelectric substrate, a distance between a surface of the acoustic velocity adjusting layer at a side away from the piezoelectric substrate and the main surface of the piezoelectric substrate is greater than a distance between a surface of the intermediate layer at a side away from the piezoelectric substrate and the main surface of the piezoelectric substrate, and less than a distance between a surface of the passivation layer at a side away from the piezoelectric substrate and the main surface of the piezoelectric substrate.

2. The surface acoustic wave resonator device according to claim 1, wherein the acoustic velocity adjusting layer is configured to accelerate the acoustic velocity in the central region, so that the acoustic velocity in the central region is different from an acoustic velocity in the first end region and an acoustic velocity in the second end region.

3. The surface acoustic wave resonator device according to claim 1, comprising at least one of following features:

wherein orthographic projections, on the piezoelectric substrate, of the portions of the plurality of interdigital electrodes located in the central region are located within an orthographic projection of the acoustic velocity adjusting layer on the piezoelectric substrate; and wherein orthographic projections, on the piezoelectric substrate, of portions of the plurality of interdigital electrodes located in the first end region, the second end region, the first peripheral region and the second peripheral region are offset from an orthographic projection of the acoustic velocity adjusting layer on the piezoelectric substrate.

4. The surface acoustic wave resonator device according to claim 1, wherein an orthographic projection of the acoustic velocity adjusting layer on the piezoelectric substrate is offset from an orthographic projection of the passivation layer on the piezoelectric substrate.

5. The surface acoustic wave resonator device according to claim 1, wherein the intermediate layer comprises a temperature compensation layer, and the acoustic velocity adjusting layer and the temperature compensation layer comprise different materials.

6. The surface acoustic wave resonator device according to claim 1, wherein the first protruding structure is configured to reduce the acoustic velocity in the first end region and the acoustic velocity in the second end region.

7. The surface acoustic wave resonator device according to claim 1, wherein the first protruding structure comprises a plurality of first mass loading blocks, and the plurality of first mass loading blocks are respectively disposed on a side, away from the piezoelectric substrate, of end parts of the plurality of interdigital electrodes located in the first end region and the second end region.

8. The surface acoustic wave resonator device according to claim 7, wherein each of the plurality of first mass loading blocks and an end part of a corresponding one interdigital electrode among the plurality of interdigital electrodes overlaps in the direction perpendicular to the main surface of the piezoelectric substrate, and has sidewalls aligned in the direction perpendicular to the main surface of the piezoelectric substrate.

9. The surface acoustic wave resonator device according to claim 1, wherein an orthographic projection of the acoustic velocity adjusting layer on the piezoelectric substrate is offset from an orthographic projection of the first protruding structure on the piezoelectric substrate.

10. The surface acoustic wave resonator device according to claim 1, wherein the acoustic velocity in the central region is greater than an acoustic velocity in the first end region and an acoustic velocity in the second end region.

11. The surface acoustic wave resonator device according to claim 1, wherein the interdigital transducer further comprises:

a first bus bar and a second bus bar, located on two opposite sides of the interdigital electrode region in the first direction, and each extending along the second direction, wherein the first bus bar is located on a side of the first peripheral region and connected with the first interdigital electrode, and the second bus bar is located on a side of the second peripheral region and connected with the second interdigital electrode;

a first additional bus bar, located in the first peripheral region, extending along the second direction, and connected with the first interdigital electrode; and a second additional bus bar, located in the second peripheral region, extending along the second direction, and connected with the second interdigital electrode.

12. The surface acoustic wave resonator device according to claim 1, further comprising:

a first reflective grating and a second reflective grating, disposed on the piezoelectric substrate and arranged on two opposite sides of the interdigital transducer in the second direction, wherein an orthographic projection of the acoustic velocity adjusting layer on the piezoelectric substrate is offset from orthographic projections of the first reflective grating and the second reflective grating on the piezoelectric substrate; or, an orthographic projection of the acoustic velocity adjusting layer on the piezoelectric substrate overlaps with an orthographic projection of the first reflective grating and/or the second reflective grating on the piezoelectric substrate.

13. The surface acoustic wave resonator device according to claim 12, further comprising:

a second protruding structure, disposed in extension regions of the first end region and the second end region in the second direction, wherein an orthographic projection of the second protruding structure on the piezoelectric substrate overlaps with the orthographic projection of the first reflective grating and/or the second reflective grating on the piezoelectric substrate.

14. The surface acoustic wave resonator device according to claim 13, wherein the second protruding structure comprises a plurality of second mass loading blocks disposed on a side of a plurality of reflective electrodes of the first reflective grating and the second reflective grating away from the piezoelectric substrate, and are located in the extension regions of the first end region and the second end region in the second direction.

15. A manufacturing method of a surface acoustic wave resonator device, wherein the surface acoustic wave resonator device has an interdigital electrode region comprising a first peripheral region, a first end region, a central region, a second end region and a second peripheral region sequentially arranged in a first direction, and the manufacturing method comprises:

providing a piezoelectric substrate;

forming an interdigital transducer on the piezoelectric substrate, wherein the interdigital transducer comprises a plurality of interdigital electrodes which are located in the interdigital electrode region and comprise a first interdigital electrode and a second interdigital electrode; the first interdigital electrode and the second interdigital electrode extend along the first direction and are alternately arranged along a second direction intersecting the first direction; the first interdigital electrode extends from the first peripheral region to the second end region, and the second interdigital electrode extends from the second peripheral region to the first end region;

forming a first protruding structure in the first end region and the second end region, and the first protruding structure is configured to change an acoustic velocity in the first end region and an acoustic velocity in the second end region, forming an intermediate layer on the piezoelectric substrate to cover the interdigital transducer;

forming an acoustic velocity adjusting layer on a side of at least a portion of the intermediate layer away from the piezoelectric substrate; and forming a passivation layer on a side of the intermediate layer away from the piezoelectric substrate, wherein the acoustic velocity adjusting layer is located in the central region, overlaps with portions of the plurality of interdigital electrodes located in the central region in a direction perpendicular to a main surface of the piezoelectric substrate, and is configured to change an acoustic velocity in the central region, wherein the intermediate layer has a recess, and a portion of the acoustic velocity adjusting layer is located in the recess of the intermediate layer; and in the direction perpendicular to the main surface of the piezoelectric substrate, a distance between a surface of the acoustic velocity adjusting layer at a side away from the piezoelectric substrate and the main surface of the piezoelectric substrate is greater than a distance between a surface of the intermediate layer at a side away from the piezoelectric substrate and the main surface of the piezoelectric substrate, and less than a distance between a surface of the passivation layer at a side away from the piezoelectric substrate and the main surface of the piezoelectric substrate.

16. The manufacturing method of the surface acoustic wave resonator device according to claim 15, wherein forming the acoustic velocity adjusting layer on the side of at least the portion of the intermediate layer away from the piezoelectric substrate comprises: performing an etching process on the intermediate layer to remove a portion of the intermediate layer located in the central region, so as to form the recess in the intermediate layer; and forming the acoustic velocity adjusting layer in the recess of the intermediate layer.

* * * * *